United States Patent
Park et al.

(10) Patent No.: US 12,133,441 B2
(45) Date of Patent: Oct. 29, 2024

(54) DISPLAY PANEL INCLUDING PERIPHERAL PROTRUSION TIP AND DISPLAY APPARATUS INCLUDING CORNER PROTRUSION TIP

(71) Applicant: Samsung Display Co., Ltd., Yongin-si (KR)

(72) Inventors: Junhyeong Park, Yongin-si (KR); Kyungmin Kim, Yongin-si (KR); Jiyeon Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 415 days.

(21) Appl. No.: 17/691,757

(22) Filed: Mar. 10, 2022

(65) Prior Publication Data
US 2023/0006174 A1    Jan. 5, 2023

(30) Foreign Application Priority Data
Jul. 1, 2021    (KR) ........................ 10-2021-0086709

(51) Int. Cl.
*H10K 59/40*    (2023.01)
*G06F 3/044*    (2006.01)
(Continued)

(52) U.S. Cl.
CPC ........... *H10K 59/40* (2023.02); *G06F 3/0445* (2019.05); *H10K 50/844* (2023.02);
(Continued)

(58) Field of Classification Search
CPC ................. G06F 3/0412; G06F 3/0445; G06F 2203/04103; H10K 50/84; H10K 50/844;
(Continued)

(56) References Cited

U.S. PATENT DOCUMENTS

2017/0287995 A1* 10/2017 Kim ..................... H10K 59/124
2019/0074459 A1    3/2019 Kim et al.
(Continued)

FOREIGN PATENT DOCUMENTS

CN    110196656 A    9/2019
KR    10-2017-0045459 A    4/2017
(Continued)

*Primary Examiner* — Cheung Lee
(74) *Attorney, Agent, or Firm* — Lewis Roca Rothgerber Christie LLP

(57) ABSTRACT

A display panel includes: a substrate including a central area and a peripheral area, the peripheral area including a first peripheral area and a second peripheral area; an insulating layer arranged on the substrate, the insulating layer including a first hole and a second hole; an inorganic layer arranged on the insulating layer, the inorganic layer including a peripheral inorganic pattern that includes a peripheral protrusion tip protruding toward at least one of the first hole or the second hole; a display element layer arranged on the insulating layer; an encapsulation layer arranged on the display element layer, the encapsulation layer including an organic encapsulation layer; and a protection layer arranged on the encapsulation layer, the protection layer including an organic protection layer. The organic encapsulation layer includes an organic encapsulation pattern filling the first hole. The organic protection layer includes a peripheral protection pattern filling the second hole.

20 Claims, 19 Drawing Sheets

(51) Int. Cl.
*H10K 50/844* (2023.01)
*H10K 50/86* (2023.01)
*H10K 59/12* (2023.01)
*H10K 59/38* (2023.01)

(52) U.S. Cl.
CPC ........... *H10K 50/865* (2023.02); *H10K 59/12* (2023.02); *H10K 59/38* (2023.02)

(58) Field of Classification Search
CPC .. H10K 50/8445; H10K 50/865; H10K 59/00; H10K 59/12; H10K 59/126; H10K 59/131; H10K 59/1315; H10K 59/38; H10K 59/40; H10K 59/873; H10K 59/8731; H10K 59/8792
See application file for complete search history.

(56) References Cited

U.S. PATENT DOCUMENTS

| | | | |
|---|---|---|---|
| 2020/0328376 A1 | 10/2020 | Seo et al. | |
| 2021/0384465 A1 | 12/2021 | Park et al. | |

FOREIGN PATENT DOCUMENTS

| | | |
|---|---|---|
| KR | 10-2019-0057829 A | 5/2019 |
| KR | 10-2020-0120804 A | 10/2020 |
| KR | 10-2021-0151634 A | 12/2021 |

\* cited by examiner

DISPLAY PANEL INCLUDING PERIPHERAL PROTRUSION TIP AND DISPLAY APPARATUS INCLUDING CORNER PROTRUSION TIP

CROSS-REFERENCE TO RELATED APPLICATION

This application claims priority to and the benefit of Korean Patent Application No. 10-2021-0086709, filed on Jul. 1, 2021, in the Korean Intellectual Property Office (KIPO), the entire disclosure of which is incorporated by reference herein.

BACKGROUND

1. Field

One or more embodiments relate to a display panel and a display apparatus.

2. Description of the Related Art

Mobile electronic apparatuses have been widely used. As mobile electronic apparatuses, not only miniaturized electronic apparatuses such as mobile phones but also tablet personal computers (PC), have been widely used recently.

To support various functions, the mobile electronic apparatuses include a display apparatus to provide a user with visual information, such as an image. Recently, because the parts driving the mobile electronic apparatuses have been miniaturized, the proportion of the display apparatus in an electronic apparatus has gradually increased and a structure that may be bent to a predetermined angle with respect to a flat state is also under development.

SUMMARY

Aspects of one or more embodiments of the present disclosure are directed toward a display panel with improved reliability and a display apparatus.

Additional aspects will be set forth in part in the description which follows and, in part, will be apparent from the description, or may be learned by practice of one or more embodiments of the present disclosure.

According to one or more embodiments, a display panel includes a substrate including a central area and a peripheral area, the peripheral area including a first peripheral area and a second peripheral area, the first peripheral area being outside the central area, the second peripheral area being outside the first peripheral area, an insulating layer arranged on the substrate, the insulating layer including a first hole and a second hole, the first hole overlapping the first peripheral area, the second hole overlapping the second peripheral area, an inorganic layer arranged on the insulating layer, the inorganic layer including a peripheral inorganic pattern that includes a peripheral protrusion tip protruding toward a center of at least one of the first hole or the second hole, a display element layer arranged on the insulating layer, the display element layer including a central display element overlapping the central area, the central display element including a first electrode, an emission layer, and a second electrode that are sequentially stacked, an encapsulation layer arranged on the display element layer, the encapsulation layer including an organic encapsulation layer, and a protection layer arranged on the encapsulation layer, the protection layer including an organic protection layer. The organic encapsulation layer includes an organic encapsulation pattern filling the first hole. The organic protection layer includes a peripheral protection pattern filling the second hole.

The peripheral protection pattern may overlap the peripheral protrusion tip.

The peripheral area may further include a third peripheral area outside the second peripheral area. The inorganic layer may further include an outer inorganic pattern including an outer protrusion tip that protrudes in a direction from the second peripheral area toward the third peripheral area. The organic protection layer may further include an outer protection pattern overlapping the outer protrusion tip.

The substrate may further include a corner area in a corner of the display panel, the corner area including a first corner area and a second corner area that surrounds the first corner area. The insulating layer may further include a first corner hole and a second corner hole, the first corner hole overlapping the first corner area, the second corner hole overlapping the second corner area. The inorganic layer may further include a corner inorganic pattern including a corner protrusion tip that protrudes toward a center at least one of the first corner hole or the second corner hole. The display element layer may further include a corner display element overlapping the first corner area. The organic encapsulation layer may further include a corner organic encapsulation pattern overlapping the corner display element, the corner organic encapsulation pattern filling the first corner hole. The organic protection layer may further include a corner protection pattern overlapping the second corner area, the corner protection pattern filling the second corner hole.

The first corner area may include a plurality of first corner areas. The plurality of first corner areas may each extend in a direction away from the central area. The second corner area may surround the plurality of first corner areas. A spaced area may be defined between a portion of the second corner area and another portion of the second corner area, the portion of the second corner area being between adjacent first corner areas from among the plurality of first corner areas, the other portion of the second corner area being between the adjacent first corner areas.

The substrate may further include an intermediate area and a separation area. The intermediate area may be between the central area and the corner area, the intermediate area may include a first intermediate area and a second intermediate area between the first intermediate area and the corner area, the separation area may be between the second corner area and the second intermediate area. The insulating layer may further include a first intermediate hole, a second intermediate hole, and a separation hole, the first intermediate hole overlapping the first intermediate area, the second intermediate hole overlapping the second intermediate area, the separation hole overlapping the separation area. The organic encapsulation pattern may fill the first intermediate hole, the organic encapsulation pattern overlapping the first intermediate area. The organic protection layer may further include an intermediate protection pattern and a separation protection pattern, the intermediate protection pattern filling the second intermediate hole, the separation protection pattern filling the separation hole.

The inorganic layer may further include an inorganic pattern line extending to surround at least a portion of the central area, the inorganic pattern line including an intermediate protrusion tip protruding toward a center of at least one of the second corner hole, the second intermediate hole, or the separation hole. At least one of the separation protection pattern or the intermediate protection pattern may overlap the intermediate protrusion tip.

The central display element may further include at least one of a first functional layer or a second functional layer, the first functional layer being between the first electrode and the emission layer, the second functional layer being between the emission layer and the second electrode. The display element layer may include a functional layer pattern including a same material as a material of at least one of the first functional layer or the second functional layer, overlap at least one of the second corner hole, the separation hole, or the second intermediate hole, and arranged between the substrate and the organic protection layer.

The display panel may further include a driving circuit overlapping the intermediate area. The display element layer may further include an intermediate display element overlapping the first intermediate area, the intermediate display element being arranged on the driving circuit.

The substrate may further include a first area between the central area and the peripheral area, the first area being adjacent to the central area in a first direction, and a second area between the central area and the peripheral area, the second area being adjacent to the central area in a second direction crossing the first direction. The corner area may surround at least a portion of the first area, the second area, and the central area.

The encapsulation layer may further include a first inorganic encapsulation layer and a second inorganic encapsulation layer, the first inorganic encapsulation layer contacting the peripheral protrusion tip, the second inorganic encapsulation layer being on the organic encapsulation layer. The first inorganic encapsulation layer may contact the second inorganic encapsulation layer in the second hole.

The display panel may further include a lower inorganic layer arranged between the substrate and the insulating layer, the lower inorganic layer including a lower peripheral inorganic pattern. At least one of the first hole or the second hole may pass through the insulating layer. The lower peripheral inorganic pattern may overlap at least one of the first hole or the second hole.

The display panel may further include a touch sensor layer arranged on the protection layer, and an anti-reflection layer arranged on the touch sensor layer, the anti-reflection layer including color filters and a black matrix.

According to one or more embodiments, a display apparatus includes a display panel, and a cover window arranged on the display panel. The display panel includes a substrate including a central area and a corner area, the corner area being at a corner of the display panel and bent, the corner area including a first corner area and a second corner area surrounding the first corner area, an insulating layer arranged on the substrate, the insulating layer including a first corner hole and a second corner hole, the first corner hole overlapping the first corner area, the second corner hole overlapping the second corner area, an inorganic layer arranged on the insulating layer, the inorganic layer including a corner inorganic pattern that has a corner protrusion tip protruding toward a center of at least one of the first corner hole or the second corner hole, a display element layer arranged on the insulating layer, the display element layer including a corner display element overlapping the first corner area, an encapsulation layer arranged on the display element layer, the encapsulation layer including an organic encapsulation layer, and a protection layer arranged on the encapsulation layer, the protection layer including an organic protection layer. The organic encapsulation layer includes a corner organic encapsulation pattern filling the first corner hole. The organic protection layer includes a corner protection pattern filling the second corner hole.

The first corner area may include a plurality of first corner areas. The plurality of first corner areas may each extend in a direction away from the central area. The second corner area may surround the plurality of first corner areas. A spaced area may be defined between a portion of the second corner area and another portion of the second corner area, the portion of the second corner area being between adjacent first corner areas from among the plurality of first corner areas, the other portion of the second corner area being between the adjacent first corner areas.

The substrate may further include an intermediate area and a separation area. The intermediate area may be between the central area and the corner area, the intermediate area may include a first intermediate area and a second intermediate area between the first intermediate area and the corner area, the separation area being between the second corner area and the second intermediate area. The insulating layer may include a first intermediate hole, a second intermediate hole, and a separation hole, the first intermediate hole overlapping the first intermediate area, the second intermediate hole overlapping the second intermediate area, the separation hole overlapping the separation area. The organic encapsulation layer may further include an organic encapsulation pattern filling the first intermediate hole, the organic encapsulation pattern overlapping the first intermediate area. The organic protection layer may further include an intermediate protection pattern and a separation protection pattern, the intermediate protection pattern filling the second intermediate hole, the separation protection pattern filling the separation hole.

The substrate may further include a first area adjacent to the central area in a first direction, the first area being bent, and a second area adjacent to the central area in a second direction crossing the first direction, the second area being bent. The corner area may surround at least a portion of the first area, the second area, and the central area.

The substrate may further include a peripheral area including a first peripheral area and a second peripheral area, the first peripheral area being outside the central area, the second peripheral area being outside the first peripheral area. The insulating layer may further include a first hole and a second hole, the first hole overlapping the first peripheral area, the second hole overlapping the second peripheral area. The inorganic layer may further include a peripheral inorganic pattern that includes a peripheral protrusion tip protruding toward a center of at least one of the first hole or the second hole. The organic encapsulation layer may further include an organic encapsulation pattern filling the first hole. The organic protection layer may further include a peripheral protection pattern filling the second hole.

The peripheral protection pattern may overlap the peripheral protrusion tip.

The peripheral area may further include a third peripheral area outside the second peripheral area. The inorganic layer may further include an outer inorganic pattern having an outer protrusion tip that protrudes in a direction from the second peripheral area toward the third peripheral area. The organic protection layer may further include an outer protection pattern overlapping the outer protrusion tip.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
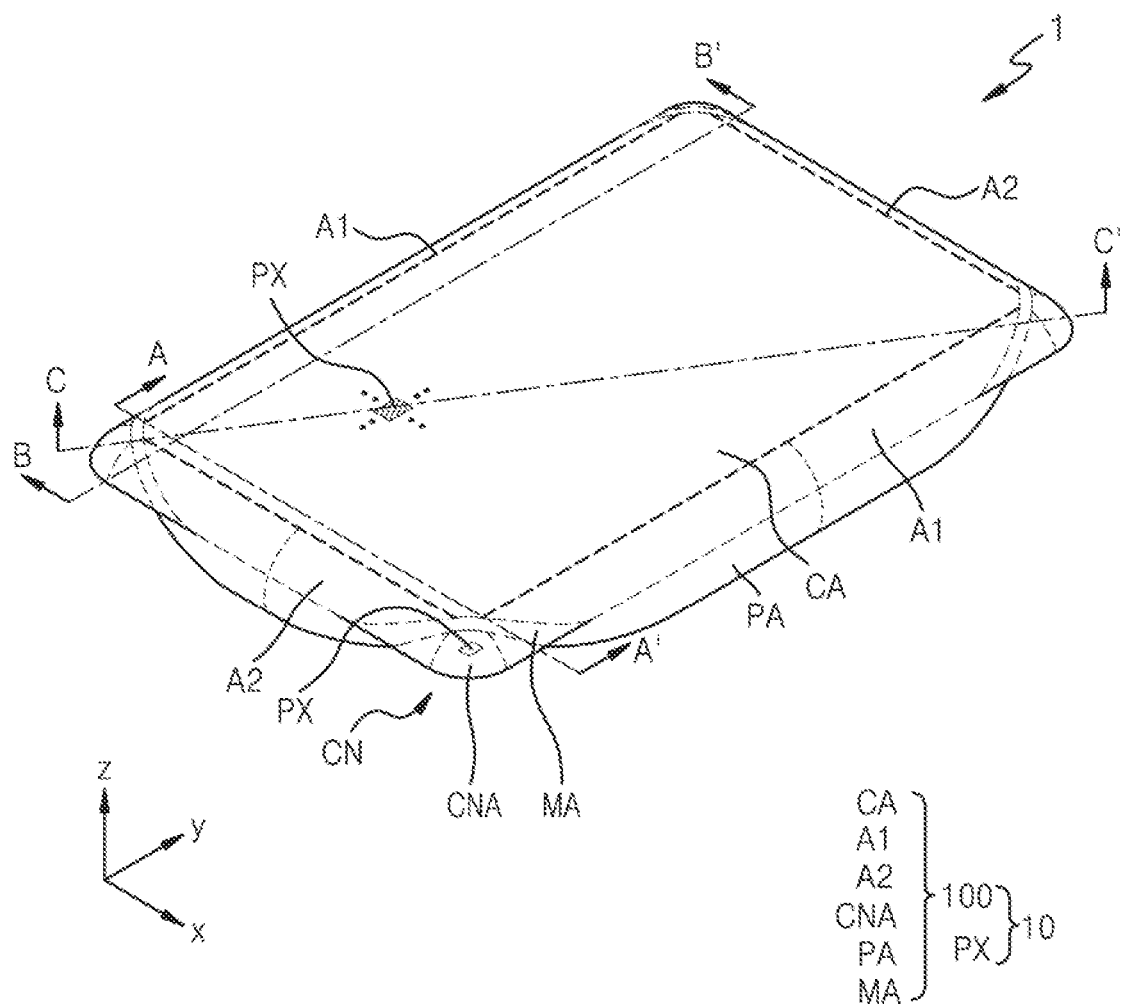
FIG. 1 is a perspective view of a display apparatus according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When one or more embodiments may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

The display apparatus is an apparatus configured to display moving images or still images and may be used in a display screen of various products including televisions, notebook computers, monitors, advertisement boards, Internet of things (IoT) as well as portable electronic apparatuses including mobile phones, smart phones, tablet personal computers (PC), mobile communication terminals, electronic organizers, electronic books, portable multimedia players (PMP), navigations, and ultra-mobile personal computers (UMPC). In addition, the display apparatus according to one or more embodiments may be used in wearable devices including smartwatches, watchphones, glasses-type displays, and head-mounted displays (HMD). In addition, the display apparatus according to one or more embodiments may be used in instrument panels for automobiles, center fascias for automobiles, or center information displays (CID) arranged on a dashboard, room mirror displays that replace side mirrors of automobiles, and displays arranged on the backside of front seats as an entertainment for back seats of automobiles.

Figure 2A:
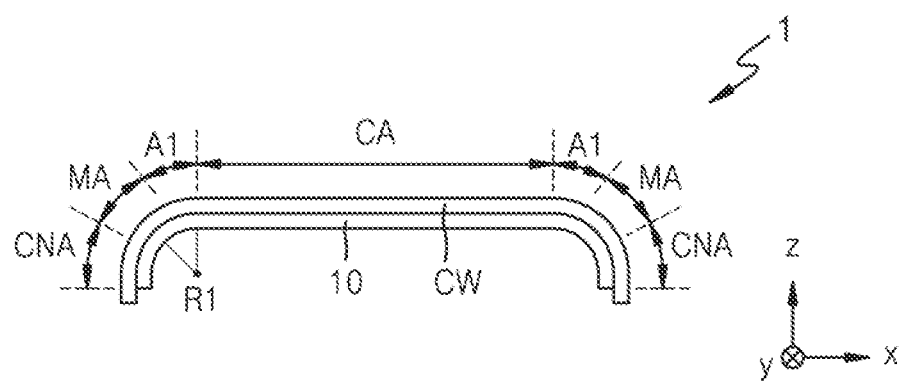
FIG. 2A is a cross-sectional view of the display apparatus of FIG. 1, taken along the line A-A'.
Figure 2B:
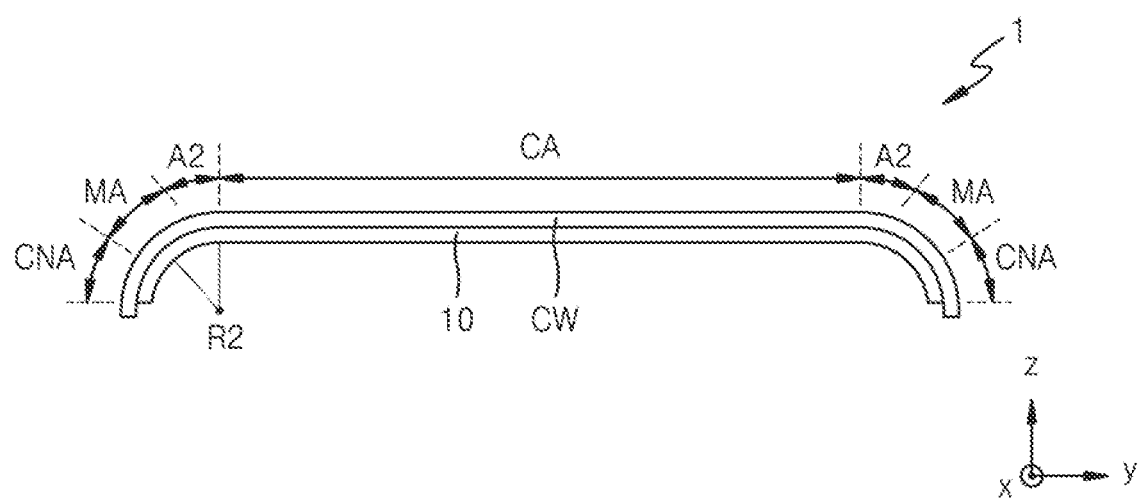
FIG. 2B is a cross-sectional view of the display apparatus of FIG. 1, taken along the line B-B'.
Figure 2C:
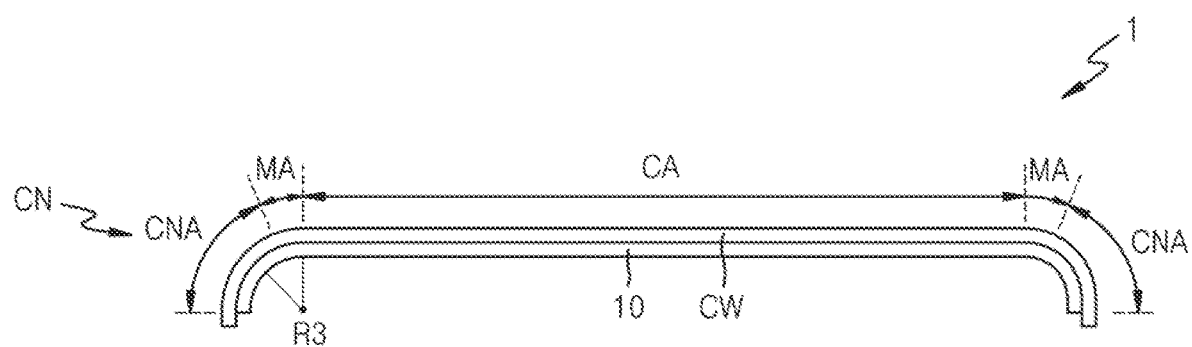
FIG. 2C is a cross-sectional view of the display apparatus of FIG. 1, taken along the line C-C'.

FIG. 1 is a perspective view of a display apparatus 1 according to one or more embodiments. FIG. 2A is a cross-sectional view of the display apparatus 1 of FIG. 1, taken along the line A-A'. FIG. 2B is a cross-sectional view of the display apparatus 1 of FIG. 1, taken along the line B-B'. FIG. 2C is a cross-sectional view of the display apparatus 1 of FIG. 1, taken along the line C-C'.

Referring to FIGS. 1 and 2A to 2C, the display apparatus 1 may display images. The display apparatus 1 may include edges in a first direction and edges in a second direction. Here, the first direction and the second direction may be directions crossing each other. As an example, the first direction and the second direction may form an acute angle. As another example, the first direction and the second direction may form an obtuse angle or cross each other at a right angle. Hereinafter, the case where the first direction and the second direction cross each other at a right angle is primarily described in more detail. As an example, the first direction may be an x-direction or a (−) x-direction, and the second direction may be a y-direction or a (−) y-direction.

In one or more embodiments, a corner CN where an edge in the first direction (e.g., the x-direction or the (−) x-direction) meets an edge in the second direction (e.g., the y-direction or the (−) y-direction) may have a preset curvature.

The display apparatus 1 may include a cover window CW and a display panel 10. The cover window CW may protect the display panel 10. In one or more embodiments, the cover window CW may be arranged on the display panel 10. In one or more embodiments, the cover window CW may be a flexible window. The cover window CW may protect the display panel 10 by bending (e.g., easily bending) according to external force without generating cracks and the like. The cover window CW may include glass, sapphire, or plastic. The cover window CW may include, for example, ultra-thin glass (UTG™) or colorless polyimide (CPI). In one or more embodiments, the cover window CW may have a structure in which a flexible polymer layer is arranged on or at one side of a glass substrate or include only a polymer layer.

The display panel 10 may be arranged under the cover window CW. In one or more embodiments, the display panel 10 may be attached on the cover window CW by a transparent adhesive member such as an optically clear adhesive (OCA).

The display panel 10 may be configured to display images. The display panel 10 may include the substrate 100 and pixels PX. The substrate 100 may include a central area CA, a first area A1, a second area A2, a corner area CNA, an intermediate area MA, and a peripheral area PA. In one or more embodiments, the shape of the substrate 100 may define the shape of the display apparatus 1.

The central area CA may be a flat region. In one or more embodiments, the display apparatus 1 may display an image (e.g., most of an image) in the central area CA.

The first area A1 may be bent and be adjacent to the central area CA in the first direction (e.g., the x-direction or the (−) x-direction). The first area A1 may be defined as a region bent from the central area CA in the cross section (e.g., an xz-cross section) in the first direction (e.g., the x-direction or the (−) x-direction). The first area A1 may extend in the second direction (e.g., the y-direction or the (−) y-direction). For example, the first area A1 may not be bent from a cross section (e.g., an yz-cross section) in the second direction (e.g., the y-direction or the (−) y-direction). The first area A1 may be connected to the central area CA in the first direction (e.g., the x-direction or the (−) x-direction). Though it is shown in FIG. 2A that the first area A1 extending in the x-direction and bent from the central area CA and the first area A1 extending in the (−) x-direction and bent from the central area CA have the same curvature, the first area A1 extending in the x-direction and bent from the central area CA may have a curvature different from the curvature of the first area A1 extending in the (−) x-direction and bent from the central area CA in another embodiment.

The second area A2 may be bent and be adjacent to the central area CA in the second direction (e.g., the y-direction or the (−) y-direction). The second area A2 may be defined as a region bent from the central area CA in the cross section (e.g., the yz-cross section) in the second direction (e.g., the y-direction or the (−) y-direction). The second area A2 may extend in the first direction (e.g., the x-direction or the (−) x-direction). The second area A2 may not be bent from the cross section (e.g., the xz-cross section) in the first direction (e.g., the x-direction or the (−) x-direction). Though it is shown in FIG. 2B that the second area A2 extending in the y-direction and bent from the central area CA and the second area A2 extending in the (−) y-direction and bent from the central area CA have the same curvature, the second area A2 extending in the y-direction and bent from the central area CA may have a curvature different from the curvature of the second area A2 extending in the (−) y-direction and bent from the central area CA in another embodiment.

The corner area CNA may be a region arranged in the corner CN. In one or more embodiments, the corner area CNA may be a region where an edge of the display apparatus 1 in the first direction (e.g., the x-direction or the (−) x-direction) meets an edge of the display apparatus 1 in the second direction (e.g., the y-direction or the (−) y-direction). In one or more embodiments, the corner area CNA may surround at least a portion of the central area CA, the first area A1, and the second area A2. The corner area CNA may surround at least a portion of the central area CA, the first area A1, the second area A2, and the intermediate area MA. In the case where the first area A1 extends in the first direction (e.g., the x-direction or the (−) x-direction) and bends and the second area A2 extends in the second direction (e.g., the y-direction or the (−) y-direction) and bends, at least a portion of the corner area CNA may extend in the first direction (e.g., the x-direction or the (−) x-direction) and bend and extend in the second direction (e.g., the y-direction or the (−) y-direction) and bend. For example, at least a portion of the corner area CNA may be a region of a plurality of curvatures where a plurality of curvatures in a plurality of directions overlap each other. In one or more embodiments, the corner area CNA may be provided in plurality.

The intermediate area MA may be arranged between the central area CA and the corner area CNA. In one or more embodiments, the intermediate area MA may extend between the first area A1 and the corner area CNA. In one or more embodiments, the intermediate area MA may extend between the second area A2 and the corner area CNA. In one or more embodiments, the intermediate area MA may be bent. A driving circuit and/or a power wiring may be arranged in the intermediate area MA, the driving circuit being configured to provide electric signals to pixels PX, and the power wiring being configured to provide power to the pixels PX. In this case, pixels PX in the intermediate area MA may overlap the driving circuit and/or the power wiring. In one or more embodiments, the driving circuit and/or the power wiring in the intermediate area MA may be omitted.

The peripheral area PA may be arranged around or outside the central area CA. In one or more embodiments, the peripheral area PA may be around or outside the first area A1. The peripheral area PA may extend from the first area A1. In one or more embodiments, the peripheral area PA may be around or outside the second area A2. The peripheral area PA may extend from the second area A2. The pixels PX may not be arranged in the peripheral area PA. Accordingly, the peripheral area PA may be a non-display area in which images are not displayed. The driving circuit and/or the power wiring may be arranged in the peripheral area PA, the driving circuit being configured to provide electric signals to pixels PX, and the power wiring being configured to provide power to the pixels PX.

Referring to FIG. 2A, the first area A1, the intermediate area MA, and a portion of the corner area CNA may be bent with a first curvature radius R1. Referring to FIG. 2B, the second area A2, the intermediate area MA, and the other portion of the corner area CNA may be bent with a second curvature radius R2. Referring to FIG. 2C, the intermediate area MA and another portion of the corner area CNA may be bent with a third curvature radius R3.

The pixel PX may be arranged over the substrate 100. In one or more embodiments, the pixel PX may be provided in plurality, and the plurality of pixels PX may be configured to display images by emitting light. In one or more embodiments, the plurality of pixels PX may each include a red sub-pixel, a green sub-pixel, and a blue sub-pixel. Alternatively, the plurality of pixels PX may each include a red sub-pixel, a green sub-pixel, a blue sub-pixel, and a white sub-pixel.

The pixel PX may be arranged in at least one of the central area CA, the first area A1, the second area A2, or the corner area CNA. In one or more embodiments, the plurality of pixels PX may be arranged in the central area CA, the first area A1, the second area A2, the corner area CNA, and the intermediate area MA. In this case, the display apparatus 1 may be configured to display images in the central area CA, the first area A1, the second area A2, the corner area CNA, and the intermediate area MA.

In one or more embodiments, the plurality of pixels PX arranged in the central area CA, the first area A1, the second area A2, the corner area CNA, and the intermediate area MA may each be configured to display an independent image (e.g., images that are independent of each other). In another embodiment, the plurality of pixels PX arranged in the central area CA, the first area A1, the second area A2, the corner area CNA, and the intermediate area MA may each be configured to display portions of one image.

In the display apparatus 1, the plurality of pixels PX may be arranged in the first area A1, the second area A2, the corner area CNA, and the intermediate area MA as well as the central area CA to display images. Accordingly, a proportion of the display area, which is a region configured to display images in the display apparatus 1, may increase. In addition, because the display apparatus 1 may display images while being bent in the corners thereof, an aesthetic sense may be improved.

Figure 3:
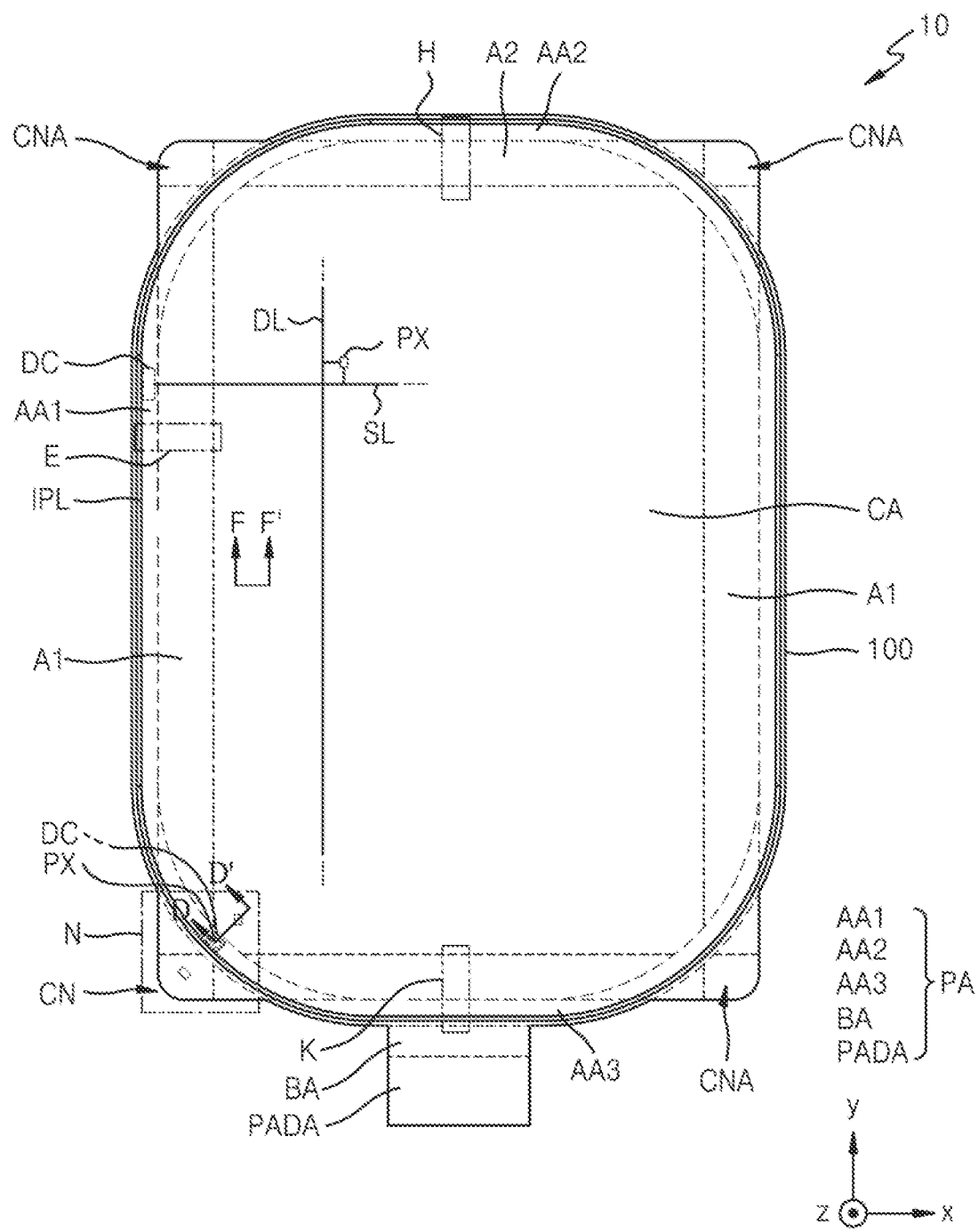
FIG. 3 is a plan view of a display panel according to one or more embodiments.

FIG. 3 is a plan view of the display panel 10 according to one or more embodiments. FIG. 3 is a plan view of the display panel 10 that is unbent.

Referring to FIG. 3, the display panel 10 may be configured to display images. The display panel 10 may include the substrate 100, the pixels PX, a driving circuit DC, and an inorganic pattern line IPL. The substrate 100 may include the central area CA, the first area A1, the second area A2, the corner area CNA, the intermediate area MA, and the peripheral area PA. The central area CA may be a flat region. In one or more embodiments, the display panel 10 may be configured to display most of an image in the central area CA.

The first area A1 may be adjacent to the central area CA in the first direction (e.g., the x-direction or the (−) x-direction). In one or more embodiments, the first area A1 may be arranged between the central area CA and the peripheral area PA. The first area A1 may extend in the first direction (e.g., the x-direction or the (−) x-direction) from the central area CA.

The second area A2 may be adjacent to the central area CA in the second direction (e.g., the y-direction or the (−) y-direction). In one or more embodiments, the second area A2 may be arranged between the central area CA and the peripheral area PA. The second area A2 may extend in the second direction (e.g., the y-direction or the (−) y-direction) from the central area CA.

The corner area CNA may be a region arranged in the corner CN of the display panel 10. In one or more embodiments, the corner area CNA may be a region where an edge of the display panel 10 in the first direction (e.g., the x-direction or the (−) x-direction) meets an edge of the display panel 10 in the second direction (e.g., the y-direction or the (−) y-direction). In one or more embodiments, the corner area CNA may surround at least a portion of the central area CA, the first area A1, and the second area A2. The corner area CNA may surround at least a portion of the central area CA, the first area A1, the second area A2, and the intermediate area MA.

The intermediate area MA may be arranged between the central area CA and the corner area CNA. In one or more embodiments, the intermediate area MA may be arranged between the first area A1 and the corner area CNA. In one or more embodiments, the intermediate area MA may extend between the first area A2 and the corner area CNA. The driving circuit DC and/or the power wiring may be arranged in the intermediate area MA, the driving circuit DC being configured to provide electric signals to the pixels PX, and the power wiring being configured to provide power to the pixels PX. In this case, the pixel PX arranged in the intermediate area MA may overlap the driving circuit DC and/or the power wiring. In one or more embodiments, the driving circuit DC and/or the power wiring in the intermediate area MA may be omitted.

The peripheral area PA may be arranged outside the central area CA. The pixel PX may not be arranged in the peripheral area PA. Accordingly, the peripheral area PA may be a non-display area in which images are not displayed. The driving circuit DC and/or the power wiring may be arranged in the peripheral area PA, the driving circuit DC being configured to provide electric signals to the pixel PX, and the power wiring being configured to provide power to the pixel PX. The peripheral area PA may include a first adjacent area AA1, a second adjacent area AA2, a third adjacent area AA3, a bending area BA, and a pad area PADA.

The first adjacent area AA1 may be arranged outside the first area A1. For example, the first area A1 may be arranged between the first adjacent area AA1 and the central area CA. The first adjacent area AA1 may extend from the first area A1. In one or more embodiments, the first adjacent area AA1 may extend in the first direction (e.g., the x-direction or the (−) x-direction) from the first area A1. In one or more embodiments, the driving circuit DC may be arranged in the first adjacent area AA1.

The second adjacent area AA2 and the third adjacent area AA3 may be arranged outside the second area A2. For example, the second area A2 (e.g., a first region of the second area A2) may be arranged between the second adjacent area AA2 and the central area CA. In addition, the second area A2 (e.g., a second region of the second area A2) may be arranged between the third adjacent area AA3 and the central area CA. The second adjacent area AA2 and the third adjacent area AA3 may extend from the second area A2. For example, as shown in FIG. 3, the second adjacent area AA2 may extend from the first region of the second area A2 and the third adjacent area AA3 may extend from the second region of the second area A2. In one or more embodiments, the second adjacent area AA2 and the third adjacent area AA3 may extend in the second direction (e.g., the y-direction or the (−) y-direction). The central area CA may be arranged between the second adjacent area AA2 and the third adjacent area AA3.

The bending area BA may be arranged outside the third adjacent area AA3. For example, the third adjacent area AA3 may be arranged between the bending area BA and the second area A2. The display panel 10 may be bent in the bending area BA. In this case, the pad area PADA may face the backside of the display panel 10 opposite the upper surface of the display panel 10 in which images are displayed. Accordingly, the area of the peripheral area PA viewed by a user may be reduced.

The pad area PADA may be arranged outside the bending area BA. For example, the bending area BA may be arranged between the third adjacent area AA3 and the pad area PADA. A pad may be arranged in the pad area PADA. The display panel 10 may receive electric signals and/or a power voltage through the pad.

At least one of the first area A1, the second area A2, the corner area CNA, or the intermediate area MA may be bent. As an example, the first area A1 and a portion of the corner area CNA may be bent from a cross section (e.g., an xz-cross section) in the first direction (e.g., the x-direction or the (−) x-direction). The second area A2 and the other portion of the corner area CNA may be bent from a cross section (e.g., a yz-cross section) in the second direction (e.g., the y-direction or the (−) y-direction). Another portion of the corner area CNA may be bent from a cross section (e.g., the xz-cross section) in the first direction (e.g., the x-direction or the (−) x-direction) and bent from a cross section (e.g., the yz-cross section) in the second direction (e.g., the y-direction or the (−) y-direction).

While the corner area CNA is bent, compression strain greater than tensile strain may occur in the corner area CNA. In this case, the substrate 100 that is contractible and a multi-layer structure on the substrate 100 may be employed in at least a portion of the corner area CNA. In one or more embodiments, the structure of the display panel 10 in the corner area CNA may be different from the structure of the display panel 10 in the central area CA.

The pixel PX, the driving circuit DC, and the inorganic pattern line IPL may be arranged over the substrate 100. The pixel PX may be arranged in at least one of the central area CA, the first area A1, the second area A2, the corner area CNA, or the intermediate area MA. In one or more embodiments, the pixel PX may be provided in plurality. The pixel PX may include a display element. In one or more embodiments, the display element may be an organic light-emitting diode including an organic emission layer. Alternatively, the display element may be a light-emitting diode LED. The size of the light-emitting diode LED may be micro scale or nano scale. As an example, the light-emitting diode may be a micro light-emitting diode. Alternatively, the light-emitting diode may be a nanorod light-emitting diode. The nanorod light-emitting diode may include gallium nitride (GaN). In one or more embodiments, a color-converting layer may be arranged on the nanorod light-emitting diode. The color-converting layer may include quantum dots. Alternatively, a display element may be a quantum-dot light-emitting diode including a quantum-dot emission layer. Alternatively, the display element may be an inorganic light-emitting diode including an inorganic semiconductor.

The pixel PX may include a plurality of sub-pixels. The plurality of sub-pixels may each emit light of a preset color from the display element. In the present specification, a sub-pixel denotes an emission area as a minimum unit implementing an image. In the case where an organic light-emitting diode is employed as a display element, the emission area may be defined by an opening of a pixel-defining layer as will be described in more detail below.

The driving circuit DC may be a scan driving circuit providing a scan signal to each pixel PX through a scan line SL. Alternatively, the driving circuit DC may be a data driving circuit providing a data signal to each pixel PX through a data line DL. In one or more embodiments, the data driving circuit may be arranged in the third adjacent area AA3 or the pad area PADA. Alternatively, the data driving circuit may be arranged on a display circuit board connected through the pad.

The inorganic pattern line IPL may be around or surround at least a portion of the central area CA. In one or more embodiments, the inorganic pattern line IPL may surround the central area CA entirely. The inorganic pattern line IPL may surround the central area CA, the first area A1, and the second area A2 entirely. In one or more embodiments, the inorganic pattern line IPL may extend between the pixel PX in the central area CA and the pixel PX in the corner area CNA. In one or more embodiments, the inorganic pattern line IPL may extend between the pixel PX in the intermediate area MA and the pixel PX in the corner area CNA. At least a portion of the inorganic pattern line IPL may be arranged in the first adjacent area AA1, the second adjacent area AA2, and the third adjacent area AA3. The inorganic pattern line IPL may be designed to prevent or reduce moisture and/or oxygen from penetrating into the pixels PX.

Figure 4:
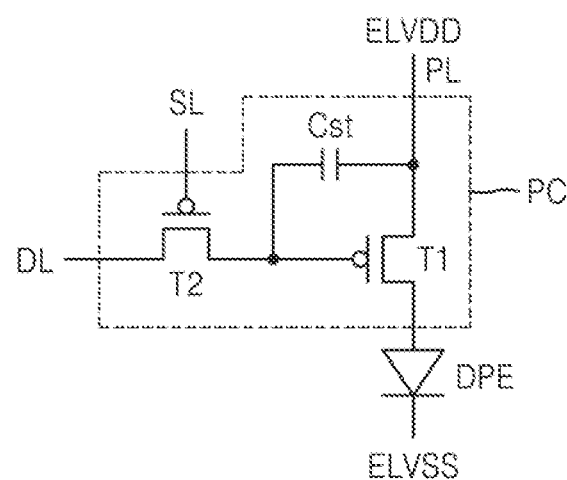
FIG. 4 is an equivalent circuit diagram of a pixel circuit applicable to a display panel.

FIG. 4 is an equivalent circuit diagram of a pixel circuit PC applicable to a display panel.

Referring to FIG. 4, the pixel circuit PC may be connected (e.g., electrically connected) to a display element DPE. The pixel circuit PC may include a driving thin-film transistor T1, a switching thin-film transistor T2, and a storage capacitor Cst. In one or more embodiments, the display element DPE may emit red, green, or blue light, or emit red, green, blue, or white light.

The switching thin-film transistor T2 may be connected to the scan line SL and the data line DL and configured to transfer a data signal or a data voltage to the driving thin-film transistor T1 based on a scan signal or a switching voltage input through the scan line SL, the data signal or the data voltage being input through the data line DL.

The storage capacitor Cst may be connected to the switching thin-film transistor T2 and a driving voltage line PL and configured to store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and configured to control a driving current to an organic light-emitting diode OLED from the driving voltage line PL according to the voltage stored in the storage capacitor Cst. The display element DPE may emit light having a preset brightness according to the driving current. An opposite electrode of the display element DPE may receive a second power voltage ELVSS.

Though it is shown in FIG. 4 that the pixel circuit PC includes two thin-film transistors and one storage capacitor, the pixel circuit PC may include three or more thin-film transistors.

Figure 5:
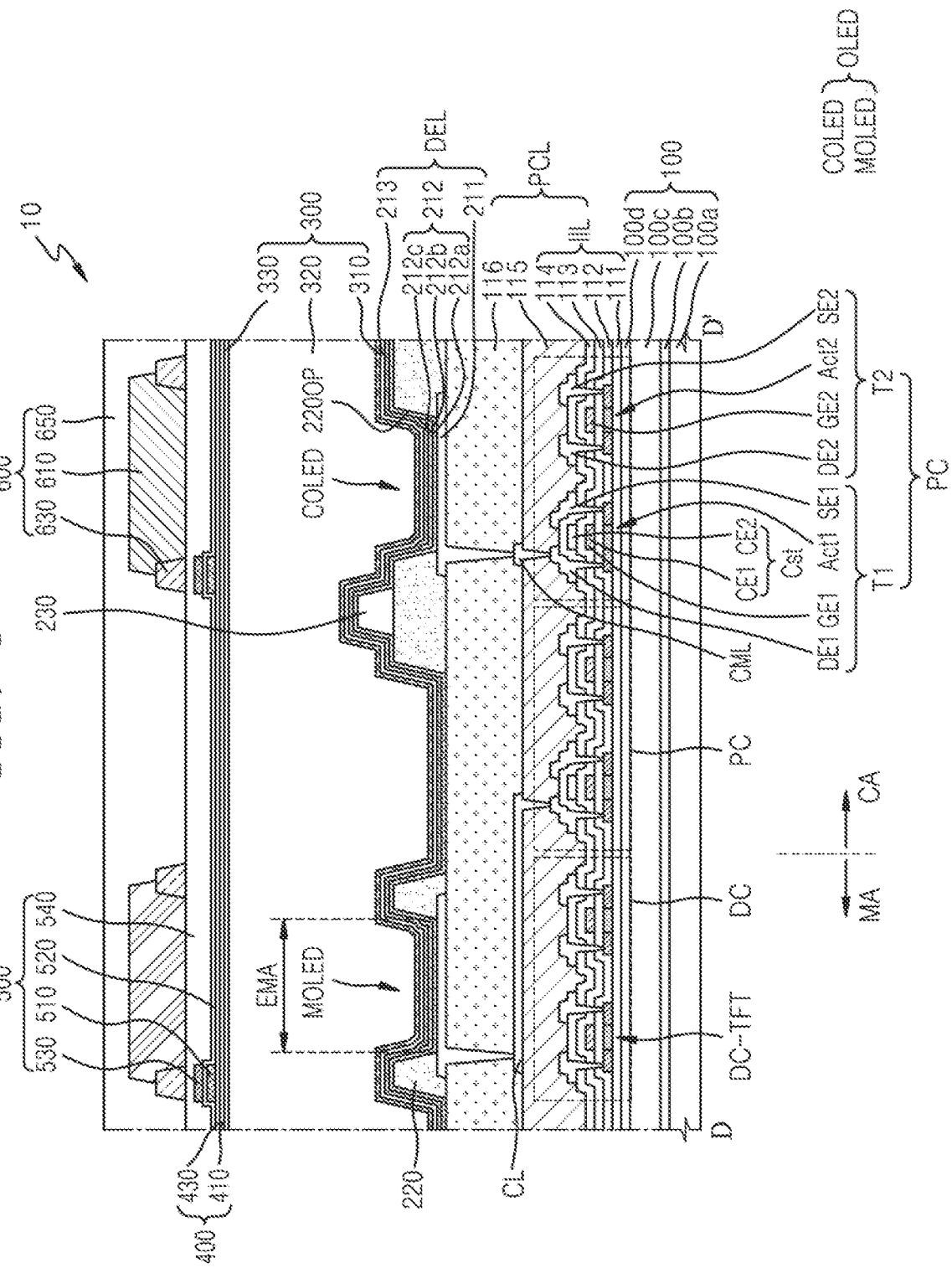
FIG. 5 is a cross-sectional view of the display panel of FIG. 3, taken along the line D-D'.

FIG. 5 is a cross-sectional view of the display panel 10 of FIG. 3, taken along the line D-D'.

Referring to FIG. 5, the display panel 10 may include the substrate 100, the pixel circuit layer PCL, the display element layer DEL, an encapsulation layer 300, a protection layer 400, a touch sensor layer 500, and an anti-reflection layer 600.

In one or more embodiments, the substrate 100 may include a first base layer 100a, a first barrier layer 100b, a second base layer 100c, and a second barrier layer 100d. In one or more embodiments, the first base layer 100a, the first barrier layer 100b, the second base layer 100c, and the second barrier layer 100d may be sequentially stacked to form the substrate 100. In another embodiment, the substrate 100 may include glass.

At least one of the first base layer 100a or the second base layer 100c may include a polymer resin such as polyethersulfone, polyacrylate, polyetherimide, polyethylene naphthalate, polyethylene terephthalate, polyphenylene sulfide, polyimide, polycarbonate, cellulose tri acetate, and/or cellulose acetate propionate.

The first barrier layer 100b and the second barrier layer 100d are barrier layers preventing or substantially preventing the penetration of external foreign substance and may include a single layer or a multi-layer structure including an inorganic material such as silicon nitride ($SiN_x$), silicon oxide ($SiO_2$) and/or silicon oxynitride (SiON).

The pixel circuit layer PCL may be arranged on the substrate 100. The pixel circuit layer PCL may include the driving circuit DC and the pixel circuit PC. In one or more embodiments, the driving circuit DC may be arranged in the intermediate area MA. In another embodiment, the driving circuit DC may not be arranged in the intermediate area MA.

In this case, the driving circuit DC may be arranged in the peripheral area PA. Hereinafter, the case where the driving circuit DC is arranged in the intermediate area MA is primarily described in more detail.

The pixel circuit PC may be arranged in the central area CA. In one or more embodiments, the pixel circuit PC may be spaced from the intermediate area MA. For example, the pixel circuit PC may not overlap the intermediate area MA. In another embodiment, the pixel circuit PC may overlap the intermediate area MA.

The driving circuit DC may include a driving circuit thin-film transistor DC-TFT. In one or more embodiments, the driving circuit DC may be connected to the scan line. The pixel circuit PC may include at least one thin-film transistor. In one or more embodiments, the pixel circuit PC may include the driving thin-film transistor T1, the switching thin-film transistor T2, and the storage capacitor Cst.

The pixel circuit layer PCL may further include an inorganic insulating layer IIL, a lower insulating layer 115, and an insulating layer 116 under and/or on elements of the driving thin-film transistor T1. The inorganic insulating layer IIL may include a buffer layer 111, a first gate insulating layer 112, a second gate insulating layer 113, and an interlayer insulating layer 114. The driving thin-film transistor T1 may include a first semiconductor layer Act1, a first gate electrode GE1, a first source electrode SE1, and a first drain electrode DE1.

The buffer layer 111 may be arranged on the substrate 100. The buffer layer 111 may include an inorganic insulating material such as silicon nitride ($SiN_x$), silicon oxide ($SiO_2$) and/or silicon oxynitride (SiON) and include a single layer or a multi-layer structure including the above inorganic insulating materials.

The first semiconductor layer Act1 may be arranged on the buffer layer 111. The first semiconductor layer Act1 may include polycrystalline silicon. Alternatively, the first semiconductor layer Act1 may include amorphous silicon, an oxide semiconductor, or an organic semiconductor. The first semiconductor layer Act1 may include a channel region, a drain region, and a source region, the drain region and the source region being respectively on or at opposite sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), and/or titanium (Ti) and have a single-layer structure or a multi-layer structure including the above materials.

The first gate insulating layer 112 between the first semiconductor layer Act1 and the first gate electrode GE1 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

An upper electrode CE2 of the storage capacitor Cst may be arranged on the second gate insulating layer 113. The upper electrode CE2 may overlap the first gate electrode GE1 therebelow. In this case, the first gate electrode GE1 of the driving thin-film transistor T1 and the upper electrode CE2 overlapping each other with the second gate insulating layer 113 therebetween may constitute the storage capacitor Cst. That is, the first gate electrode GE1 of the driving thin-film transistor T1 may serve as a lower electrode CE1 of the storage capacitor Cst. For example, the storage capacitor Cst may overlap the driving thin-film transistor T1. In one or more embodiments, the storage capacitor Cst may not overlap the driving thin-film transistor T1. The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer structure including the above materials.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may include a single layer or a multi-layer structure including the above inorganic insulating materials.

The first drain electrode DE1 and the first source electrode SE1 may each be arranged on the interlayer insulating layer 114. The first drain electrode DE1 and the first source electrode SE1 may each include a material having high conductivity. The first drain electrode DE1 and the first source electrode SE1 may each include a conductive material including molybdenum (Mo), aluminum (Al), copper (Cu), and/or titanium (Ti) and have a single-layer structure or a multi-layer structure including the above materials. In one or more embodiments, the first drain electrode DE1 and the first source electrode SE1 may each have a multi-layer structure of Ti/Al/Ti.

The switching thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, detailed descriptions thereof are omitted.

Similar to the switching thin-film transistor T2, the driving circuit thin-film transistor DC-TFT may include a driving circuit semiconductor layer, a driving circuit gate electrode, a driving circuit source electrode, and a driving circuit drain electrode.

The lower insulating layer 115 may be arranged on at least one thin-film transistor. In one or more embodiments, the lower insulating layer 115 may cover the first drain electrode DE1 and the first source electrode SE1. The lower insulating layer 115 may include an organic material. The lower insulating layer 115 may include an organic insulating materials including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

A connection electrode CML and a connection line CL may be arranged on the lower insulating layer 115. In this case, the connection electrode CML and the connection line CL may each be connected to the first drain electrode DE1 or the first source electrode SE1 through a contact hole of the lower insulating layer 115. The connection electrode CML and the connection line CL may each include a material having high conductivity. The connection electrode CML and the connection line CL may each include a conductive material including molybdenum (Mo), aluminum (Al), copper (Cu), and/or titanium (Ti) and have a single-layer structure or a multi-layer structure including the above materials. In one or more embodiments, the connection electrode CML and the connection line CL may have a multi-layer structure of Ti/Al/Ti.

In one or more embodiments, the connection line CL may extend from the central area CA to or toward the intermediate area MA. In another embodiment, the connection line CL may extend from the peripheral area PA (e.g., see FIG. 3) or the corner area CNA (e.g., see FIG. 3) to or toward the intermediate area MA. In another embodiment, the connection line CL may extend from the first area A1 (e.g., see FIG. 3) and/or the second area A2 (e.g., see FIG. 3) to or toward the intermediate area MA. The connection wiring CL may overlap the driving circuit thin-film transistor DC-TFT.

The insulating layer 116 may cover the connection electrode CML and the connection line CL. The insulating layer 116 may include an organic material. The insulating layer 116 may include an organic insulating materials including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

The display element layer DEL may be arranged on the pixel circuit layer PCL. The display element layer DEL may include an organic light-emitting diode OLED as a display element, a pixel-defining layer 220, and a spacer 230. The display element layer DEL may include a plurality of organic light-emitting diodes OLED. In one or more embodiments, one of the plurality of organic light-emitting diodes OLED may be arranged in the central area CA. As an example, as a central display element, a central organic light-emitting diode COLED may be arranged in the central area CA. Another of the plurality of organic light-emitting diodes OLED may be arranged in the intermediate area MA. As an example, as an intermediate display element, an intermediate organic light-emitting diode MOLED may be arranged in the intermediate area MA. The intermediate organic light-emitting diode MOLED arranged in the intermediate area MA may overlap the driving circuit DC. Accordingly, in the present embodiment, the display panel 10 may be configured to display images even in the intermediate area MA in which the driving circuit DC is arranged.

The central organic light-emitting diode COLED may be connected (e.g., electrically connected) to the connection line CML through a contact hole of the insulating layer 116. The intermediate organic light-emitting diode MOLED may be connected (e.g., electrically connected) to the connection line CL through a contact hole of the insulating layer 116. The organic light-emitting diode OLED may include a first electrode 211, an intermediate layer 212, and a second electrode 213.

The first electrode 211 may be arranged on the insulating layer 116. The first electrode 211 may be connected (e.g., electrically connected) to the connection electrode CML or the connection line CL through a contact hole of the insulating layer 116. In one or more embodiments, the first electrode 211 may be a pixel electrode. The first electrode

211 may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). As another example, the first electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first electrode 211 may further include a layer on or under the reflective layer, the layer including ITO, IZO, ZnO, or $In_2O_3$.

The pixel-defining layer 220 may be arranged on the first electrode 211, the pixel-defining layer 220 including an opening 2200P that exposes the central portion of the first electrode 211. The opening 2200P may define an emission area of light (referred to as an emission area EMA, hereinafter) emitted from the organic light-emitting diode OLED. As an example, the width of the opening 2200P may correspond to the width of the emission area EMA. In addition, the width of the opening 2200P may correspond to the width of a sub-pixel.

In one or more embodiments, the pixel-defining layer 220 may include an organic insulating material. In another embodiment, the pixel-defining layer 220 may include an inorganic insulating material such as silicon oxide ($SiO_2$), silicon nitride ($SiN_x$), and/or silicon oxynitride (SiON). In another embodiment, the pixel-defining layer 220 may include an organic insulating material and an inorganic insulating material. In one or more embodiments, the pixel-defining layer 220 may include a light-blocking material and the light-blocking material may be black. The light-blocking material may include a resin including carbon black, carbon nanotubes, and black dye, or paste, metal particles, for example, nickel, aluminum, molybdenum, and an alloy thereof, metal oxide particles (e.g., chrome oxide), or metal nitride particles (e.g., chrome nitride), and the like. In the case where the pixel-defining layer 220 includes a light-blocking material, external light reflection due to metal structures arranged below the pixel-defining layer 220 may be reduced.

The spacer 230 may be arranged on the pixel-defining layer 220. In a method of manufacturing a display apparatus, the spacer 230 may designed to prevent or reduce destruction of the substrate 100 and/or a multi-layer on the substrate 100. In the method of manufacturing a display apparatus, a mask sheet may be used. In this case, the mask sheet may enter the inside of the opening 2200P of the pixel-defining layer 220 or be closely attached to the pixel-defining layer 220. While deposition materials are deposited on the substrate 100, the spacer 230 may prevent or reduce a portion of the substrate 100 and the multi-layer from being damaged or destroyed.

The spacer 230 may include an organic material such as polyimide. Alternatively, the spacer 230 may include an inorganic insulating material such as silicon oxide ($SiO_2$) and/or silicon nitride ($SiN_x$) or include an organic insulating material and an inorganic insulating material. In one or more embodiments, the spacer 230 may include a material different from that of the pixel-defining layer 220. Alternatively, in another embodiment, the spacer 230 may include the same material as the material of the pixel-defining layer 220. In this case, the pixel-defining layer 220 and the spacer 230 may be formed concurrently (e.g., simultaneously) during a mask process that uses a half-tone mask and the like.

The intermediate layer 212 may be arranged on the pixel-defining layer 220. The intermediate layer 212 may include an emission layer 212b arranged in the opening 2200P of the pixel-defining layer 220. The emission layer 212b may include a polymer organic material or a low-molecular weight organic material that emits light of a preset color.

The intermediate layer 212 may further include at least one of a first functional layer 212a or a second functional layer 212c, the first functional layer 212a being between the first electrode 211 and the emission layer 212b, and the second functional layer 212c being between the emission layer 212b and the second electrode 213. In one or more embodiments, the first functional layer 212a and the second functional layer 212c may be respectively arranged under and on the emission layer 212b. The first functional layer 212a may include, for example, a hole transport layer (HTL) and/or a hole injection layer (HIL). The second functional layer 212c may include an electron transport layer (ETL) and/or an electron injection layer (EIL). Like the second electrode 213 described below, the first functional layer 212a and/or the second functional layer 212c may be common layers formed to cover the substrate 100 entirely.

The second electrode 213 may be arranged on the intermediate layer 212. In one or more embodiments, the second electrode 213 may be an opposite electrode. The second electrode 213 may include a conductive material having a low work function. As an example, the second electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or an alloy thereof. Alternatively, the second electrode 213 may further include a layer on or under the (semi) transparent layer, the layer including ITO, IZO, ZnO, or $In_2O_3$.

In one or more embodiments, the second electrode 213 may further include a capping layer. The capping layer may include lithium fluoride (LiF), an inorganic material, and/or an organic material.

The encapsulation layer 300 may be arranged on the second electrode 213. In one or more embodiments, the encapsulation layer 300 may include at least one inorganic encapsulation layer and at least one organic encapsulation layer. In one or more embodiments, the encapsulation layer 300 may include a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may each include at least one inorganic material from among aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and silicon oxynitride (SiON). The organic encapsulation layer 320 may include a polymer-based material. The polymer-based material may include an acryl-based resin, an epoxy-based resin, polyimide, and polyethylene. In one or more embodiments, the organic encapsulation layer 320 may include acrylate.

The protection layer 400 may be arranged on the encapsulation layer 300. The protection layer 400 may protect the encapsulation layer 300. As an example, the protection layer 400 may prevent or substantially prevent cracks from occurring in at least one of the first inorganic encapsulation layer 310 or the second inorganic encapsulation layer 330. The protection layer 400 may include a first inorganic protection layer 410 and a second inorganic protection layer 430. In one or more embodiments, the first inorganic protection layer 410 may include an inorganic material. As an example, the first inorganic protection layer 410 may include at least one inorganic material from among aluminum oxide ($Al_2O_3$), titanium oxide (TiO$_2$), tantalum oxide (Ta$_2$O$_5$), hafnium oxide (HfO$_2$), zinc oxide (ZnO$_2$), silicon oxide (SiO$_2$), silicon nitride (SiN$_x$), and silicon oxynitride (SiON). In one or more embodiments, the first inorganic protection layer 410 may be omitted.

The second inorganic protection layer 430 may be arranged on the first inorganic protection layer 410. The second inorganic protection layer 430 may include an inorganic material. The second inorganic protection layer 430 may include at least one inorganic material from among aluminum oxide (Al$_2$O$_3$), titanium oxide (TiO$_2$), tantalum oxide (Ta$_2$O$_5$), hafnium oxide (HfO$_2$), zinc oxide (ZnO$_2$), silicon oxide (SiO$_2$), silicon nitride (SiN$_x$), and silicon oxynitride (SiON).

The touch sensor layer 500 may be arranged on the protection layer 400. The touch sensor layer 500 may obtain coordinate information corresponding to an external input, for example, a touch event. The touch sensor layer 500 may include a first touch conductive layer 510, a first touch insulating layer 520, a second touch conductive layer 530, and a second touch insulating layer 540.

The first touch conductive layer 510 may be arranged on the second inorganic protection layer 430. The first touch conductive layer 510 may include a conductive material. As an example, the first touch conductive layer 510 may include at least one of molybdenum (Mo), aluminum (Al), copper (Cu), or titanium (Ti). In one or more embodiments, the first touch conductive layer 510 may have a multi-layer structure of Ti/Al/Ti in which a titanium layer, an aluminum layer, and a titanium layer are sequentially stacked.

The first touch insulating layer 520 may be arranged on the first touch conductive layer 510. In one or more embodiments, the first touch insulating layer 520 may include an inorganic material. As an example, the first touch insulating layer 520 may include at least one inorganic material from among aluminum oxide (Al$_2$O$_3$), titanium oxide (TiO$_2$), tantalum oxide (Ta$_2$O$_5$), hafnium oxide (HfO$_2$), zinc oxide (ZnO$_2$), silicon oxide (SiO$_2$), silicon nitride (SiN$_x$), and silicon oxynitride (SiON).

The second touch conductive layer 530 may be arranged on the first touch insulating layer 520. In one or more embodiments, the first touch insulating layer 520 may include a contact hole. The second touch conductive layer 530 may be connected to the first touch conductive layer 510 through the contact hole of the first touch insulating layer 520. The second touch conductive layer 530 may include a conductive material. As an example, the second touch conductive layer 530 may include at least one of molybdenum (Mo), aluminum (Al), copper (Cu), or titanium (Ti). In one or more embodiments, the second touch conductive layer 530 may have a multi-layer structure of Ti/Al/Ti in which a titanium layer, an aluminum layer, and a titanium layer are sequentially stacked.

The second touch insulating layer 540 may be arranged on the second touch conductive layer 530. In one or more embodiments, the upper surface of the second touch insulating layer 540 may be flat. In one or more embodiments, the second touch insulating layer 540 may include an organic material. As an example, the second touch insulating layer 540 may include a polymer-based material. The polymer-based material may be transparent. As an example, the second touch insulating layer 540 may include a silicon-based resin, an acryl-based resin, an epoxy-based resin, polyimide, and/or polyethylene. In another embodiment, the second touch insulating layer 540 may include an inorganic material.

The anti-reflection layer 600 may reduce the reflectivity of light incident toward the display panel 10 from the outside. The anti-reflection layer 600 may raise color purity of light emitted from the display panel 10. The anti-reflection layer 600 may be arranged on the touch sensor layer 500. In one or more embodiments, the anti-reflection layer 600 may include color filters 610, a black matrix 630, and a planarization layer 650. The color filter 610 may overlap the organic light-emitting diode OLED, which is a display element. The color filter 610 may be arranged by taking into account the color of light emitted from the organic light-emitting diode OLED. The color filter 610 may include red, green, or blue pigment or dye. Alternatively, the color filter 610 may further include quantum dots in addition to the pigment or dye. Alternatively, the color filter 610 may not include the pigment or dye and may include scattering particles such as titanium oxide.

The black matrix 630 may at least partially absorb external light or reflected light. The black matrix 630 may include black pigment. In one or more embodiments, the black matrix 630 may be adjacent to the color filter 610. In one or more embodiments, the black matrix 630 may overlap at least one of the first touch conductive layer 510 and/or the second touch conductive layer 530.

The planarization layer 650 may be arranged on the color filters 610 and the black matrix 630. The upper surface of the planarization layer 650 may be flat. In one or more embodiments, the planarization layer 650 may include an organic material. As an example, the planarization layer 650 may include a polymer-based material. The polymer-based material may be transparent. As an example, the planarization layer 650 may include a silicon-based resin, an acryl-based resin, an epoxy-based resin, polyimide, and/or polyethylene.

In another embodiment, the anti-reflection layer 600 may include a retarder and/or a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a set arrangement (e.g., a predetermined arrangement). Each of the retarder and the polarizer may further include a protective film.

In another embodiment, the anti-reflection layer 600 may include a destructive interference structure. The destructive interference structure may include a first reflection layer and a second reflection layer respectively arranged on or at different layers. First-reflected light and second-reflected light respectively reflected by the first reflection layer and the second reflection layer may create destructive-interference (e.g., create destructive-interference by destructively interfering with each other) and thus the reflectivity of external light may be reduced.

Figure 6A:
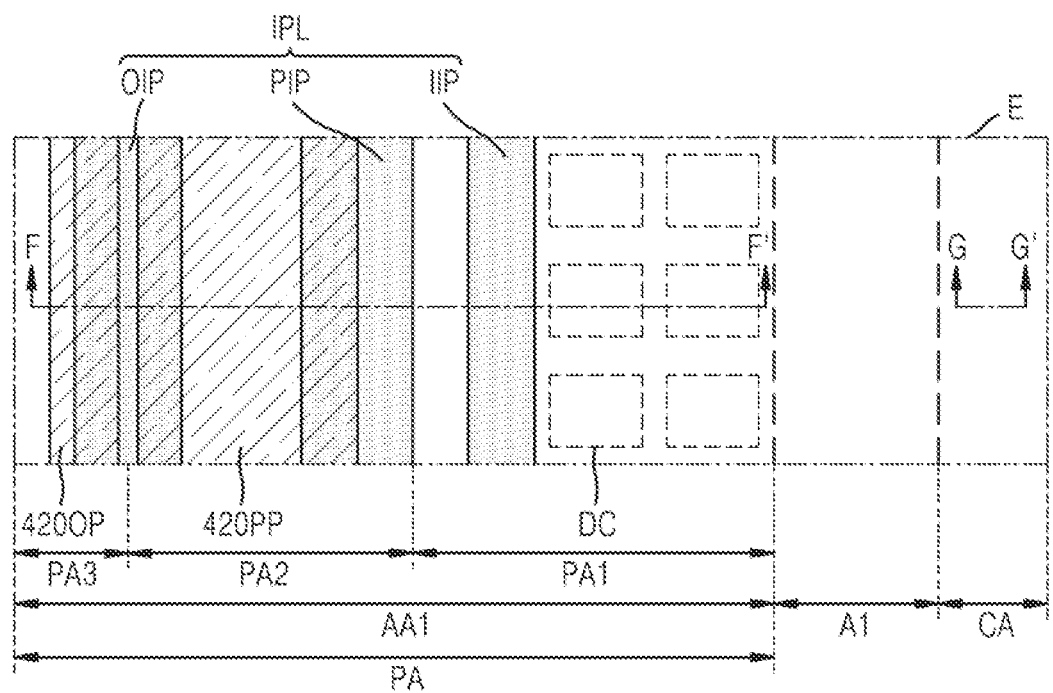
FIG. 6A is an enlarged view of a region E of the display panel of FIG. 3.
Figure 6A:
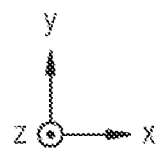
Figure 6B:
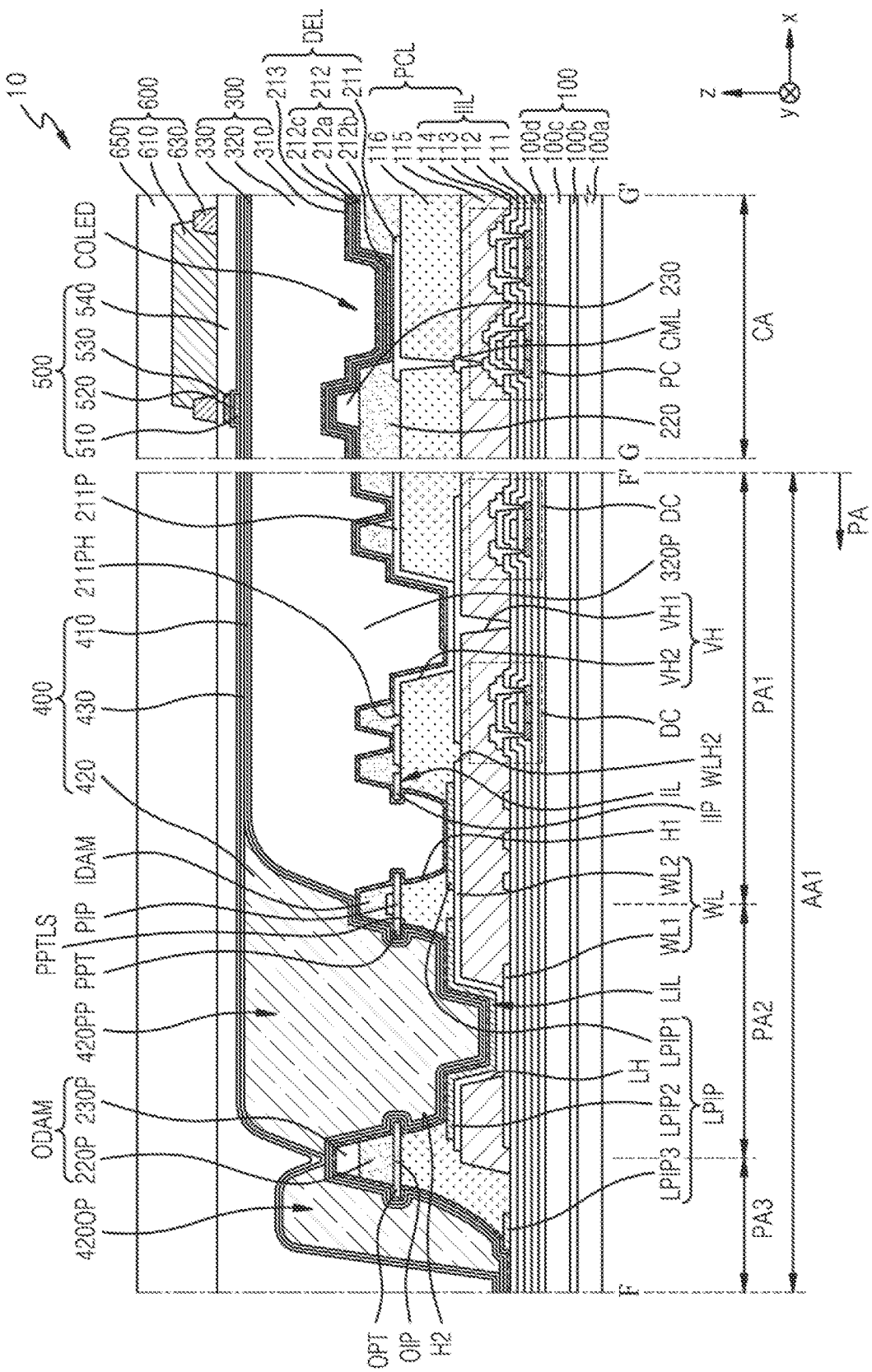
FIG. 6B is a cross-sectional view of the display panel of FIG. 6A, taken along the lines F-F' and G-G' according to one or more embodiments.

FIG. 6A is an enlarged view of a region E of the display panel 10 of FIG. 3. FIG. 6B is a cross-sectional view of the display panel of FIG. 6A, taken along the lines F-F' and G-G' according to one or more embodiments. In FIGS. 6A and 6B, the same reference numerals as those of FIGS. 3 and 5 denote the same members, repeated descriptions thereof are omitted.

Referring to FIGS. 6A and 6B, the display panel 10 may include the substrate 100, the pixel circuit layer PCL, a lower inorganic layer LIL, an inorganic layer IL, the display element layer DEL, the encapsulation layer 300, the protection layer 400, the touch sensor layer 500, and the anti-reflection layer 600.

The substrate 100 may include the central area CA, the first area A1, and the peripheral area PA. The first area A1 may be adjacent to the central area CA in the first direction (e.g., the x-direction or the (−) x-direction). The peripheral area PA may be arranged outside the central area CA. In one or more embodiments, the first area A1 may be arranged outside the central area CA, and the peripheral area PA may be arranged outside the first area A1. For example, the first area A1 may be arranged between the peripheral area PA and the central area CA.

The peripheral area PA may include the first adjacent area AA1. The first adjacent area AA1 may include a first peripheral area PA1, a second peripheral area PA2, and a third peripheral area PA3. The first peripheral area PA1 may be arranged outside the central area CA. The second peripheral area PA2 may be arranged outside the first peripheral area PA1. For example, the first peripheral area PA1 may be arranged between the second peripheral area PA2 and the central area CA. The third peripheral area PA3 may be arranged outside the second peripheral area PA2. For example, the second peripheral area PA2 may be arranged between the first peripheral area PA1 and the third peripheral area PA3.

The pixel circuit layer PCL may be arranged over the substrate 100. The pixel circuit layer PCL may include the driving circuit DC, the pixel circuit PC, the inorganic insulating layer IIL, a wiring WL, the lower insulating layer 115, the connection electrode CML, and the insulating layer 116. The pixel circuit PC may overlap the central area CA. The wiring WL and the driving circuit DC may overlap the peripheral area PA. The wiring WL may include a first wiring WL1 and a second wiring WL2.

The inorganic insulating layer IIL may be arranged on the substrate 100. In one or more embodiments, the inorganic insulating layer IIL may include the buffer layer 111, the first gate insulating layer 112, the second gate insulating layer 113, and the interlayer insulating layer 114.

The first wiring WL1 may be arranged on the inorganic insulating layer IIL. The first wiring WL1 may be configured to transfer a power voltage and/or a signal to the central organic light-emitting diode COLED as a display element. The first wiring WL1 may include a conductive material including molybdenum (Mo), aluminum (Al), copper (Cu), and/or titanium (Ti) and have a single-layer structure or a multi-layer structure including the above materials. In one or more embodiments, the first wiring WL1 may have a multi-layer structure of Ti/Al/Ti.

In one or more embodiments, a first lower wiring to be arranged between the first gate insulating layer 112 and the second gate insulating layer 113 may be further provided. In one or more embodiments, a second lower wiring to be arranged between the second gate insulating layer 113 and the interlayer insulating layer 114 may be further provided.

The lower insulating layer 115 may be arranged on the inorganic insulating layer IIL. In one or more embodiments, the lower insulating layer 115 may be arranged between the substrate 100 and the insulating layer 116. The lower insulating layer 115 may cover at least a portion of the first wiring WL1. Accordingly, the lower insulating layer 115 may prevent or reduce deterioration of the lateral surface of the first wiring WL1. The lower insulating layer 115 may include a lower hole LH overlapping the first wiring WL1. In one or more embodiments, the lower hole LH may be provided in plurality.

The lower insulating layer 115 may include a first valley hole VH1. In one or more embodiments, the first valley hole VH1 may overlap the first peripheral area PA1. The first valley hole VH1 may prevent or reduce moisture or foreign substance generated in an outer region from penetrating into the central area CA through the lower insulating layer 115. In one or more embodiments, the driving circuit DC may be provided in plurality, and the first valley hole VH1 may be arranged between a plurality of driving circuits DC adjacent to each other.

The second wiring WL2 may be arranged on the lower insulating layer 115. The second wiring WL2 may be arranged between the lower insulating layer 115 and the insulating layer 116. In one or more embodiments, the second wiring WL2 may overlap the first valley hole VH1. In one or more embodiments, the second wiring WL2 may contact the inorganic insulating layer IIL in the first valley hole VH1.

The second wiring WL2 may include a second wiring hole WLH2 exposing at least a portion of the lower insulating layer 115. In one or more embodiments, the second wiring WL2 may include a plurality of second wiring holes WLH2. The second wiring hole WLH2 may serve as a path configured to discharge a gas occurring from the lower insulating layer 115 while the display panel 10 is manufactured. Accordingly, the second wiring hole WLH2 may prevent or reduce an issue in which a gas occurring from the lower insulating layer 115 penetrates into the central area CA and damages the central organic light-emitting diode COLED.

The second wiring WL2 may be connected (e.g., electrically connected) to the first wiring WL1. The second wiring WL2 may be connected to the first wiring WL1 through the lower hole LH. The second wiring WL2 may overlap the lower hole LH and be connected (e.g., electrically connected) to the first wiring WL1 through the lower hole LH. The second wiring WL2 may include a conductive material including molybdenum (Mo), aluminum (Al), copper (Cu), and titanium (Ti) and/or have a single-layer structure or a multi-layer structure including the above materials. In one or more embodiments, the second wiring WL2 may have a multi-layer structure of Ti/Al/Ti. The second wiring WL2 may include the same material as the material of the connection electrode CML.

The lower inorganic layer LIL may overlap the peripheral area PA (e.g., the second peripheral area PA2). The lower inorganic layer LIL may not overlap the central area CA. The lower inorganic layer LIL may be arranged under the insulating layer 116. In one or more embodiments, the lower inorganic layer LIL may be arranged between the substrate 100 and the insulating layer 116. As an example, the lower inorganic layer LIL may be arranged between the inorganic insulating layer IIL and the insulating layer 116. As another example, the lower inorganic layer LIL may be arranged between the lower insulating layer 115 and the insulating layer 116.

The lower inorganic layer LIL may include a lower peripheral inorganic pattern LPIP. In one or more embodiments, the lower peripheral inorganic pattern LPIP may be arranged on the second wiring WL2. In one or more embodiments, the lower peripheral inorganic pattern LPIP may overlap the lower hole LH. In one or more embodiments, the lower peripheral inorganic pattern LPIP (e.g., portions of the lower peripheral inorganic pattern LPIP) may extend between the lower insulating layer 115 and the insulating layer 116.

In one or more embodiments, the lower peripheral inorganic pattern LPIP may include a first lower peripheral inorganic pattern LPIP1, a second lower peripheral inorganic pattern LPIP2, and a third lower peripheral inorganic pattern LPIP3. In one or more embodiments, the first lower peripheral inorganic pattern LPIP1 may overlap the first peripheral area PA1. The first lower peripheral inorganic pattern LPIP1 may be arranged between the lower insulating layer 115 and the insulating layer 116. The second lower peripheral inorganic pattern LPIP2 may overlap the second peripheral area PA2. The second lower peripheral inorganic pattern LPIP2 may be arranged between the lower insulating layer 115 and the insulating layer 116. The third lower peripheral inorganic pattern LPIP3 may overlap the third peripheral area PA3. The third lower peripheral inorganic pattern LPIP3 may be arranged between the inorganic insulating layer IIL and the insulating layer 116.

The insulating layer 116 may be arranged over the substrate 100. The insulating layer 116 may be arranged on the lower insulating layer 115 and the lower inorganic layer LIL. The insulating layer 116 may cover the edges of the second wiring WL2. Accordingly, the insulating layer 116 may prevent or reduce the deterioration of the lateral surfaces of the second wiring WL2. The insulating layer 116 may include a first hole H1 and a second hole H2.

The first hole H1 may overlap the first peripheral area PA1. The first hole H1 may overlap the first lower peripheral inorganic pattern LPIP1. The second hole H2 may overlap the second peripheral area PA2. The second hole H2 may overlap the second lower peripheral inorganic pattern LPIP2. In one or more embodiments, at least one of the first hole H1 and the second hole H2 may pass through the insulating layer 116. The first hole H1 and the second hole H2 may be formed by etching the insulating layer 116. The lower peripheral inorganic pattern LPIP may prevent or reduce an element below the lower peripheral inorganic pattern LPIP from being over-etched. As an example, the lower peripheral inorganic pattern LPIP may prevent or reduce an issue that the second wiring WL2 is over-etched and a resistance thereof increases. In one or more embodiments, at least one of the first hole H1 or the second hole H2 may not pass through the insulating layer 116. In this case, at least one of the first hole H1 or the second hole H2 may be a groove of the insulating layer 116. In one or more embodiments, the lower inorganic layer LIL may be omitted.

The insulating layer 116 may include a second valley hole VH2. The second valley hole VH2 may overlap the first peripheral area PA1. In one or more embodiments, the second valley hole VH2 may overlap the first valley hole VH1. In this case, the insulating layers including an organic material may include a valley hole including the first valley hole VH1 and the second valley hole VH2. The second valley hole VH2 may prevent or reduce an issue in which moisture or foreign substance occurring in an outer region penetrates into the central area CA through the insulating layer 116.

The insulating layer IL may be arranged on the insulating layer 116. The insulating layer IL may overlap the peripheral area PA. In one or more embodiments, the inorganic layer IL may not overlap the central area CA. The inorganic layer IL may include the inorganic pattern line IPL. In one or more embodiments, the inorganic pattern line IPL may extend in the second direction (e.g., the y-direction or the (−) y-direction) in the peripheral area PA. As an example, the inorganic pattern line IPL may extend in the second direction (e.g., the y-direction or the (−) y-direction) in the first adjacent area AA1. The inorganic pattern line IPL may include a peripheral inorganic pattern PIP, an inner peripheral inorganic pattern IIP, and an outer peripheral inorganic pattern OIP. The peripheral inorganic pattern PIP, the inner peripheral inorganic pattern IIP, and the outer peripheral inorganic pattern OIP may be spaced from each other.

The peripheral inorganic pattern PIP may include a peripheral protrusion tip PPT protruding toward the center (e.g., center in a plan view) of at least one of the first hole H1 or the second hole H2. In one or more embodiments, the peripheral inorganic pattern PIP may protrude toward the center of the first hole H1 and/or the center of the second hole H2. Accordingly, a lower surface PPTLS of the peripheral protrusion tip PPT may be exposed in at least one of the first hole H1 or the center of the second hole H2. That is, the display panel 10 may have an undercut structure in the peripheral area PA.

The inner peripheral inorganic pattern IIP may overlap the first peripheral area PA1. The inner peripheral inorganic pattern IIP may include a protrusion tip protruding toward the center of the first hole H1. Accordingly, the lower surface of the protrusion tip of the inner peripheral inorganic pattern IIP may be exposed in the first hole H1.

The outer peripheral inorganic pattern OIP may have a protrusion tip protruding toward the center of the second hole H2. Accordingly, the lower surface of the protrusion tip of the outer peripheral inorganic pattern OIP may be exposed in the second hole H2. In one or more embodiments, the outer peripheral inorganic pattern OIP may include an outer protrusion tip OPT protruding in a direction (e.g., a (−) x-direction) from the second peripheral area PA2 to the third peripheral area PA3.

The display element layer DEL may be arranged on the insulating layer 116. The display element layer DEL may include a display element, an electrode pattern 211P, the pixel-defining layer 220, the spacer 230, a first pattern 220P, and a second pattern 230P. The central organic light-emitting diode OLED as a display element may overlap the central area CA. The central organic light-emitting diode OLED may include the first electrode 211, the intermediate layer 212 including the emission layer 212b, and the second electrode 213.

The electrode pattern 211P may be arranged on the insulating layer 116. The electrode pattern 211P may overlap the peripheral area PA. In one or more embodiments, the electrode pattern 211P may overlap the second valley hole VH2. In one or more embodiments, the electrode pattern 211P may be connected (e.g., electrically connected) to the second wiring WL2. As an example, the electrode pattern 211P may be connected (e.g., electrically connected) to the second wiring WL2 through the second valley hole VH2. The electrode pattern 211P may include an electrode pattern hole 211PH. The electrode pattern hole 211PH may serve as a path configured to discharge a gas occurring from at least one of the lower insulating layer 115 or the insulating layer 116 while the display panel 10 is manufactured. Accordingly, the electrode pattern hole 211PH may prevent or reduce an issue in which a gas occurring from at least one of the lower insulating layer 115 or the insulating layer 116 penetrates into the central area CA and deteriorates the central organic light-emitting diode COLED.

The electrode pattern 211P may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the third wiring WL3 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the electrode pattern 211P may further include a layer on or under the reflective layer, the layer including ITO, IZO, ZnO, or In$_2$O$_3$. In one or more embodiments, the electrode pattern 211P may include the same material as the material of the first electrode 211.

The first pattern 220P may overlap the peripheral area PA. The first pattern 220P may be provided in plurality in the peripheral area PA. In one or more embodiments, one of the plurality of first patterns 220P may cover the lateral surface of the electrode pattern 211P. One of the plurality of first patterns 220P may prevent or reduce the deterioration of the lateral surface of the electrode pattern 211P. In one or more embodiments, the first pattern 220P may include the same material as the material of the pixel-defining layer 220.

The second pattern 230P may be arranged on the first pattern 220P. The second pattern 230P may include the same material as the material of the spacer 230. In one or more embodiments, the first pattern 220P and the second pattern 230P arranged on the outer peripheral inorganic pattern OIP may constitute an outer dam ODAM. For example, the outer dam ODAM may be arranged on the outer peripheral inorganic pattern OIP and may include the first pattern 220P and the second pattern 230P.

The first pattern 220P arranged on the peripheral inorganic pattern PIP may configure an inner dam IDAM. For example, the inner dam IDAM may overlap the peripheral inorganic pattern PIP and include the first pattern 220P.

The inorganic layer IL may be an element configured to improve the reliability of the display panel 10. In one or more embodiments, to increase an area in which images are displayed in the display panel 10, the first functional layer 212a and the second functional layer 212c may be formed over a wide area. The first functional layer 212a and the second functional layer 212c may each include an organic material. External oxygen or moisture and the like may be introduced into the central area CA through at least one of the first functional layer 212a or the second functional layer 212c. The oxygen or moisture may damage the central organic light-emitting diode COLED arranged in the central area CA. In the present embodiment, the inorganic layer IL may include the protrusion tip protruding toward the center of at least one of the first hole H1 or the second hole H2 and thus disconnect the first functional layer 212a and the second functional layer 212c and prevent or reduce the flow of external moisture and oxygen into the central organic light-emitting diode COLED. Accordingly, the reliability of the display panel 10 may be improved.

The second electrode 213 may extend from the central area CA to or toward the second valley hole VH2. In one or more embodiments, the second electrode 213 may be connected to the electrode pattern 211P overlapping the second valley hole VH2. Accordingly, in one or more embodiments, the second electrode 213 may receive a power voltage.

The encapsulation layer 300 may be arranged on the display element layer DEL. The encapsulation layer 300 may overlap the central area CA and the peripheral area PA. The encapsulation layer 300 may include the first inorganic encapsulation layer 310, the organic encapsulation layer 320, and the second inorganic encapsulation layer 330.

The first inorganic encapsulation layer 310 and the second inorganic encapsulation layer 330 may extend from the central area CA to or toward the peripheral area PA. In one or more embodiments, the first inorganic encapsulation layer 310 and the second inorganic encapsulation layer 330 may extend from the central organic light-emitting diode COLED (e.g., the central organic light-emitting diode COLED in the central area CA) to or toward the third peripheral area PA3.

The first inorganic encapsulation layer 310 may contact (e.g., directly contact) the inorganic layer IL. In one or more embodiments, the first inorganic encapsulation layer 310 may contact (e.g., directly contact) the protrusion tips of the inorganic layer IL. As an example, the first inorganic encapsulation layer 310 may contact (e.g., directly contact) the protrusion tip of the inner peripheral inorganic pattern IIP. The first inorganic encapsulation layer 310 may contact (e.g., directly contact) the peripheral protrusion tip PPT of the peripheral inorganic pattern PIP. In one or more embodiments, the first inorganic encapsulation layer 310 may contact (e.g., directly contact) the lower surface PPTLS of the peripheral protrusion tip PPT of the peripheral inorganic pattern PIP. The first inorganic encapsulation layer 310 may contact (e.g., directly contact) the outer peripheral inorganic pattern OIP. In one or more embodiments, the first inorganic encapsulation layer 310 may contact (e.g., directly contact) the lower inorganic layer LIL. As an example, the first inorganic encapsulation layer 310 may contact (e.g., directly contact) at least one of the first lower peripheral inorganic pattern LPIP1, the second lower peripheral inorganic pattern LPIP2, or the third lower peripheral inorganic pattern LPIP3. In one or more embodiments, the first inorganic encapsulation layer 310 may contact (e.g., directly contact) the inorganic insulating layer IIL in the third peripheral area PA3.

As described above, the first inorganic encapsulation layer 310 may contact (e.g., directly contact) the lower inorganic layer LIL and/or the inorganic layer IL. Accordingly, introduction of external moisture and oxygen into the central organic light-emitting diode COLED may be prevented or reduced.

The organic encapsulation layer 320 may extend from the central area CA to or toward the peripheral area PA. The organic encapsulation layer 320 may fill the second valley hole VH2. The organic encapsulation layer 320 may overlap the first valley hole VH1 and the second valley hole VH2.

The organic encapsulation layer 320 may include an organic encapsulation pattern 320P. The organic encapsulation pattern 320P may extend from the first peripheral area PA1 to or toward the second peripheral area PA2. In one or more embodiments, the organic encapsulation pattern 320P may be in the first peripheral area PA1 and not in the second peripheral area PA2. The organic encapsulation pattern 320P may fill the first hole H1. In one or more embodiments, the organic encapsulation pattern 320P may extend to the inner dam IDAM. For example, the organic encapsulation pattern 320P may extend to the peripheral inorganic pattern PIP. The inner dam IDAM may control the flow of the organic material forming the organic encapsulation layer 320.

The second inorganic encapsulation layer 330 may be arranged on the organic encapsulation layer 320. The second inorganic encapsulation layer 330 may contact (e.g., directly contact) the first inorganic encapsulation layer 310 on the inner dam IDAM. In one or more embodiments, the second inorganic encapsulation layer 330 may contact (e.g., directly contact) the first inorganic encapsulation layer 310 in the second hole H2.

The protection layer 400 may be arranged on the encapsulation layer 300. The protection layer 400 may protect the encapsulation layer 300. The protection layer 400 may include a first inorganic protection layer 410, an organic protection layer 420, and a second inorganic protection layer 430.

The first inorganic protection layer 410 and the second inorganic protection layer 430 may extend from the central area CA to or toward the peripheral area PA. In one or more embodiments, the first inorganic protection layer 410 and the second inorganic protection layer 430 may extend from the central organic light-emitting diode COLED, which is a display element, to or toward the third peripheral area PA3. In one or more embodiments, the first inorganic protection layer 410 may be omitted.

The organic protection layer 420 may be arranged on the first inorganic protection layer 410. The organic protection layer 420 may overlap the second peripheral area PA2 and the third peripheral area PA3. In one or more embodiments, the organic protection layer 420 may extend from the second peripheral area PA2 to or toward the first peripheral area PA1 and overlap the edge of the organic encapsulation layer 320. The organic protection layer 420 may include a peripheral protection pattern 420PP and an outer protection pattern 420OP. In one or more embodiments, the peripheral protection pattern 420PP may be separated from and/or spaced from the outer protection pattern 420OP in the first adjacent area AA1.

The peripheral protection pattern 420PP may overlap the second peripheral area PA2. The peripheral protection pattern 420PP may overlap the second hole H2. In one or more embodiments, the peripheral protection pattern 420PP may overlap the peripheral protrusion tip PPT of the peripheral inorganic pattern PIP. The peripheral protection pattern 420PP may surround the peripheral protrusion tip PPT of the peripheral inorganic pattern PIP. In addition, the peripheral protection pattern 420PP may overlap the peripheral protrusion tip PPT, the first inorganic encapsulation layer 310 and the second inorganic encapsulation layer 330. When the peripheral protection pattern 420PP is omitted, due to external impacts, cracks may occur in the peripheral protrusion tip PPT, the first inorganic encapsulation layer 310 and/or the second inorganic encapsulation layer 330 that does not overlap the organic encapsulation layer 320. In this case, oxygen or moisture may penetrate through the cracks. In the present embodiment, the peripheral protection pattern 420PP may prevent or reduce an issue that cracks occur in the peripheral protrusion tip PPT, the first inorganic encapsulation layer 310 and/or the second inorganic encapsulation layer 330 due to external impacts, and thus, the reliability of the display panel 10 may be increased.

The outer protection pattern 420OP may overlap the third peripheral area PA3. The outer protection pattern 420OP may overlap the outer protrusion tip OPT of the outer peripheral inorganic pattern OIP. The outer protection pattern 420OP may surround the outer protrusion tip OPT of the outer peripheral inorganic pattern OIP. In addition, the outer protection pattern 420OP may overlap the outer protrusion tip OPT, the first inorganic encapsulation layer 310 and the second inorganic encapsulation layer 330. Accordingly, the outer protection pattern 420OP may prevent or reduce an issue that cracks occur in the outer protrusion tip OPT, the first inorganic encapsulation layer 310 and/or the second inorganic encapsulation layer 330 due to external impacts, and thus, the reliability of the display panel 10 may be increased.

The second inorganic protection layer 430 may be arranged on the organic protection layer 420. The second inorganic protection layer 430 may contact (e.g., directly contact) the first inorganic protection layer 410 in the third peripheral area PA3. In one or more embodiments, in the case where the peripheral protection pattern 420PP is separated from and/or spaced from the outer protection pattern 420OP, the second inorganic protection layer 430 may contact (e.g., directly contact) the first inorganic protection layer 410 on the outer dam ODAM.

The protection layer 400 may prevent or reduce cracks of the protrusion tip of the inorganic layer IL. In addition, the protection layer 400 may increase the reliability of the display panel 10 by increasing the length of a path through which oxygen or moisture is transmitted from the outside.

The touch sensor layer 500 may be arranged on the protection layer 400. The touch sensor layer 500 may include a first touch conductive layer 510, a first touch insulating layer 520, a second touch conductive layer 530, and a second touch insulating layer 540. In one or more embodiments, the first touch insulating layer 520 may extend on the second inorganic protection layer 430. The second touch insulating layer 540 may overlap the central area CA and the peripheral area PA and be arranged on the second inorganic protection layer 430. The second touch insulating layer 540 may overlap the central area CA and the peripheral area PA.

The anti-reflection layer 600 may be arranged on the touch sensor layer 500. In one or more embodiments, the anti-reflection layer 600 may include the color filter 610, the black matrix 630, and the planarization layer 650. The planarization layer 650 may overlap the central area CA and the peripheral area PA.

Figure 7:
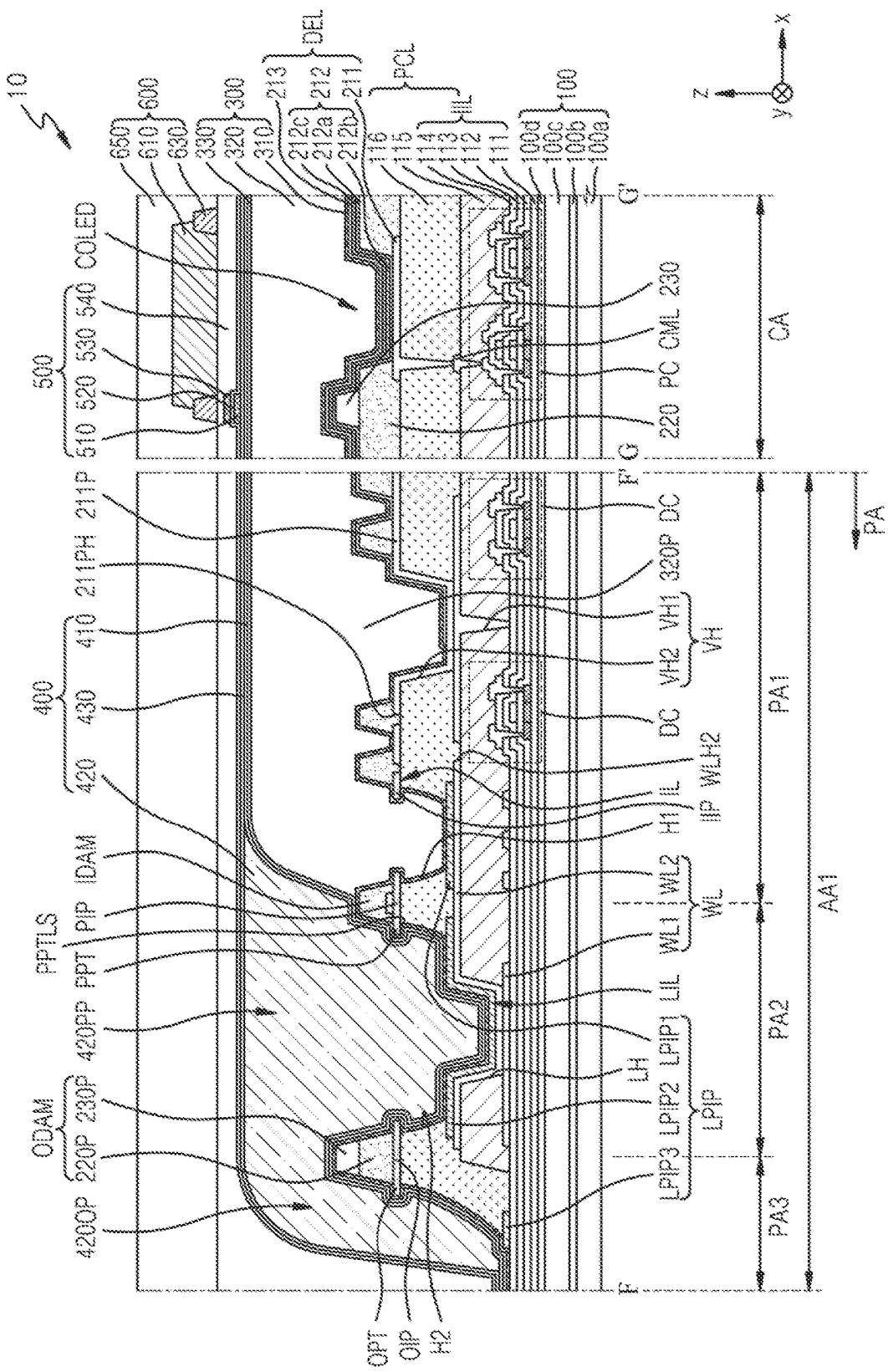
FIG. 7 is a cross-sectional view of the display panel of FIG. 6A, taken along the lines F-F' and G-G' according to another embodiment.

FIG. 7 is a cross-sectional view of the display panel 10 of FIG. 6A, taken along the lines F-F' and G-G' according to another embodiment. In FIG. 7, the same reference numerals as those of FIG. 6B denote the same members, repeated descriptions thereof are omitted.

Referring to FIG. 7, the display panel 10 may include the substrate 100, the pixel circuit layer PCL, the lower inorganic layer LIL, the inorganic layer IL, the display element layer DEL, the encapsulation layer 300, the protection layer 400, the touch sensor layer 500, and the anti-reflection layer 600.

The protection layer 400 may be arranged on the encapsulation layer 300. The protection layer 400 may protect the encapsulation layer 300. The protection layer 400 may include the first inorganic protection layer 410, the organic protection layer 420, and the second inorganic protection layer 430.

The organic protection layer 420 may be arranged on the first inorganic protection layer 410. The organic protection layer 420 may overlap the second peripheral area PA2 and the third peripheral area PA3. In one or more embodiments, the organic protection layer 420 may extend from the second peripheral area PA2 to or toward the first peripheral area PA1 and overlap the edge of the organic encapsulation layer 320. The organic protection layer 420 may include the peripheral protection pattern 420PP and the outer protection pattern 420OP. In one or more embodiments, the peripheral protection pattern 420PP and the outer protection pattern 420OP may be provided as one body (e.g., a monolithic structure) in the first peripheral area AA1. In this case, the peripheral protection pattern 420PP and the outer protection pattern 420OP may surround the outer dam ODAM. In addition, the second inorganic protection layer 430 may contact (e.g., directly contact) the first inorganic protection layer 410 in the third peripheral area PA3.

Figure 8A:
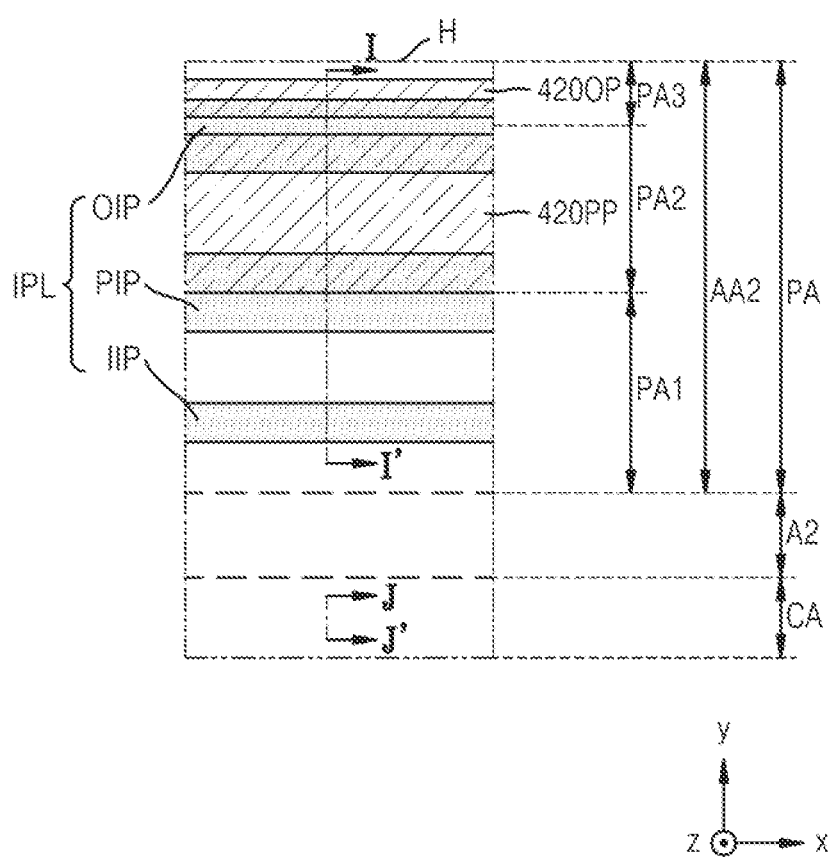
FIG. 8A is an enlarged view of a region H of the display panel of FIG. 3.
Figure 8B:
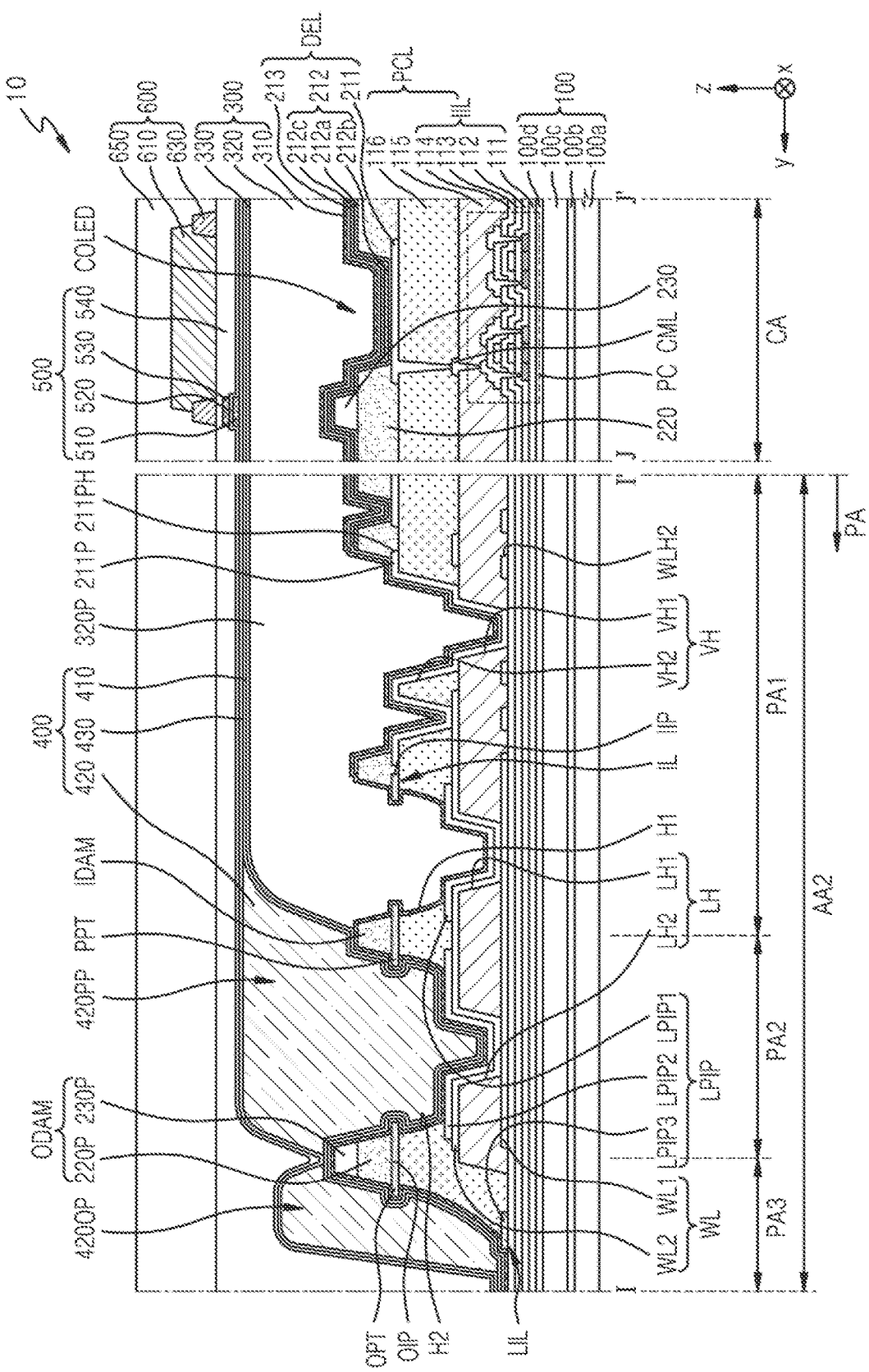
FIG. 8B is a cross-sectional view of the display panel of FIG. 8A, taken along the lines I-I' and J-J'.

FIG. 8A is an enlarged view of a region H of the display panel 10 of FIG. 3. FIG. 8B is a cross-sectional view of the display panel 10 of FIG. 8A, taken along the lines I-I' and J-J'. In FIGS. 8A and 8B, the same reference numerals as those of FIGS. 6A and 6B denote the same members, repeated descriptions thereof are omitted.

Referring to FIGS. 8A and 8B, the display panel 10 may include the substrate 100, the lower inorganic layer LIL, the pixel circuit layer PCL, the inorganic layer IL, the display element layer DEL, the encapsulation layer 300, the protection layer 400, the touch sensor layer 500, and the anti-reflection layer 600.

The substrate 100 may include the central area CA, the second area A2, and the peripheral area PA. The second area A2 may be adjacent to the central area CA in the second direction (e.g., the y-direction or the (−) y-direction). The peripheral area PA may be arranged outside the central area CA. In one or more embodiments, the second area A2 may be arranged outside the central area CA, and the peripheral area PA may be arranged outside the second area A2. For example, the second area A2 may be arranged between the peripheral area PA and the central area CA.

In one or more embodiments, the peripheral area PA may include the second adjacent area AA2. The second adjacent area AA2 may include the first peripheral area PA1, the second peripheral area PA2, and the third peripheral area PA3. The first peripheral area PA1 may be arranged outside the central area CA. The second peripheral area PA2 may be arranged outside the first peripheral area PA1. For example, the first peripheral area PA1 may be arranged between the second peripheral area PA2 and the central area CA. The third peripheral area PA3 may be arranged outside the second peripheral area PA2. For example, the second peripheral area PA2 may be arranged between the first peripheral area PA1 and the third peripheral area PA3.

The pixel circuit layer PCL may be arranged on the substrate 100. The pixel circuit layer PCL may include the pixel circuit PC, the inorganic insulating layer IIL, the wiring WL, the lower insulating layer 115, the connection electrode CML, and the insulating layer 116. The pixel circuit PC may overlap the central area CA. The wiring WL may overlap the peripheral area PA. The wiring WL may include the first wiring WL1 and the second wiring WL2.

The lower insulating layer 115 may be arranged on the inorganic insulating layer IIL. In one or more embodiments, the lower insulating layer 115 may be arranged between the substrate 100 and the insulating layer 116. The lower insulating layer 115 may cover at least a portion of the first wiring WL1. Accordingly, the lower insulating layer 115 may prevent or reduce the deterioration of the lateral surface of the first wiring WL1. The lower insulating layer 115 may include the lower hole LH overlapping the first wiring WL1. In one or more embodiments, the lower hole LH may be provided in plurality in the lower insulating layer 115. In one or more embodiments, the lower hole LH may include a first lower hole LH1 and a second lower hole LH2. In one or more embodiments, the first lower hole LH1 may overlap the first peripheral area PA1. The second lower hole LH2 may overlap the second peripheral area PA2.

The lower inorganic layer LIL may overlap the peripheral area PA. The lower inorganic layer LIL may not overlap the central area CA. The lower inorganic layer LIL may be arranged under the insulating layer 116. In one or more embodiments, the lower inorganic layer LIL may be arranged between the substrate 100 and the insulating layer 116. As an example, the lower inorganic layer LIL may be arranged between the inorganic insulating layer IIL and the insulating layer 116. As another example, the lower inorganic layer LIL may be arranged between the lower insulating layer 115 and the insulating layer 116.

The lower inorganic layer LIL may include the lower peripheral inorganic pattern LPIP. In one or more embodiments, the lower peripheral inorganic pattern LPIP may be arranged on the second wiring WL2. In one or more embodiments, the lower peripheral inorganic pattern LPIP may overlap the lower hole LH. The lower peripheral inorganic pattern LPIP may overlap the first lower hole LH1 and the second lower hole LH2. In one or more embodiments, the lower peripheral inorganic pattern LPIP may include the first lower peripheral inorganic pattern LPIP1, the second lower peripheral inorganic pattern LPIP2, and the third lower peripheral inorganic pattern LPIP3. The first lower peripheral inorganic pattern LPIP1 may overlap the first lower hole LH1 and the second lower peripheral inorganic pattern LPIP2 may overlap the second lower hole LH2.

The insulating layer 116 may be arranged over the substrate 100. The insulating layer 116 may be arranged on the lower insulating layer 115 and the lower inorganic layer LIL. The insulating layer 116 may cover the edge of the second wiring WL2. Accordingly, the insulating layer 116 may prevent or reduce the deterioration of the lateral surface of the second wiring WL2. The insulating layer 116 may include the first hole H1 and the second hole H2. The first hole H1 may overlap the first peripheral area PA1. The first hole H1 may overlap the first lower peripheral inorganic pattern LPIP1. In one or more embodiments, the first hole H1 may overlap the first lower hole LH1. The second hole H2 may overlap the second peripheral area PA2. The second hole H2 may overlap the second lower peripheral inorganic pattern LPIP2. In one or more embodiments, the second hole H2 may overlap the second lower hole LH2.

The inorganic layer IL may be arranged on the insulating layer 116. The inorganic layer IL may overlap the peripheral area PA. In one or more embodiments, the inorganic layer IL may not overlap the central area CA. The inorganic layer IL may include an inorganic pattern line IPL. In one or more embodiments, the inorganic pattern line IPL may extend in the first direction (e.g., the x-direction or the (−) x-direction) in the peripheral area PA. As an example, the inorganic pattern line IPL may extend in the first direction (e.g., the x-direction or the (−) x-direction) in the second adjacent area AA2. The display element layer DEL may be arranged on the insulating layer 116.

The encapsulation layer 300 may be arranged on the display element layer DEL. The encapsulation layer 300 may be arranged in the central area CA and the peripheral area PA. The encapsulation layer 300 may include the first inorganic encapsulation layer 310, the organic encapsulation layer 320, and the second inorganic encapsulation layer 330.

The protection layer 400 may be arranged on the encapsulation layer 300. The protection layer 400 may protect the encapsulation layer 300. The protection layer 400 may include the first inorganic protection layer 410, the organic protection layer 420, and the second inorganic protection layer 430. The organic protection layer 420 may include the peripheral protection pattern 420PP and the outer protection pattern 420OP. In one or more embodiments, the peripheral protection pattern 420PP may be separated from and/or spaced from the outer protection pattern 420OP in the second adjacent area AA2. In another embodiment, the peripheral protection pattern 420PP and the outer protection pattern 420OP may be provided as one body (e.g., a monolithic structure) in the second adjacent area AA2.

Figure 9A:
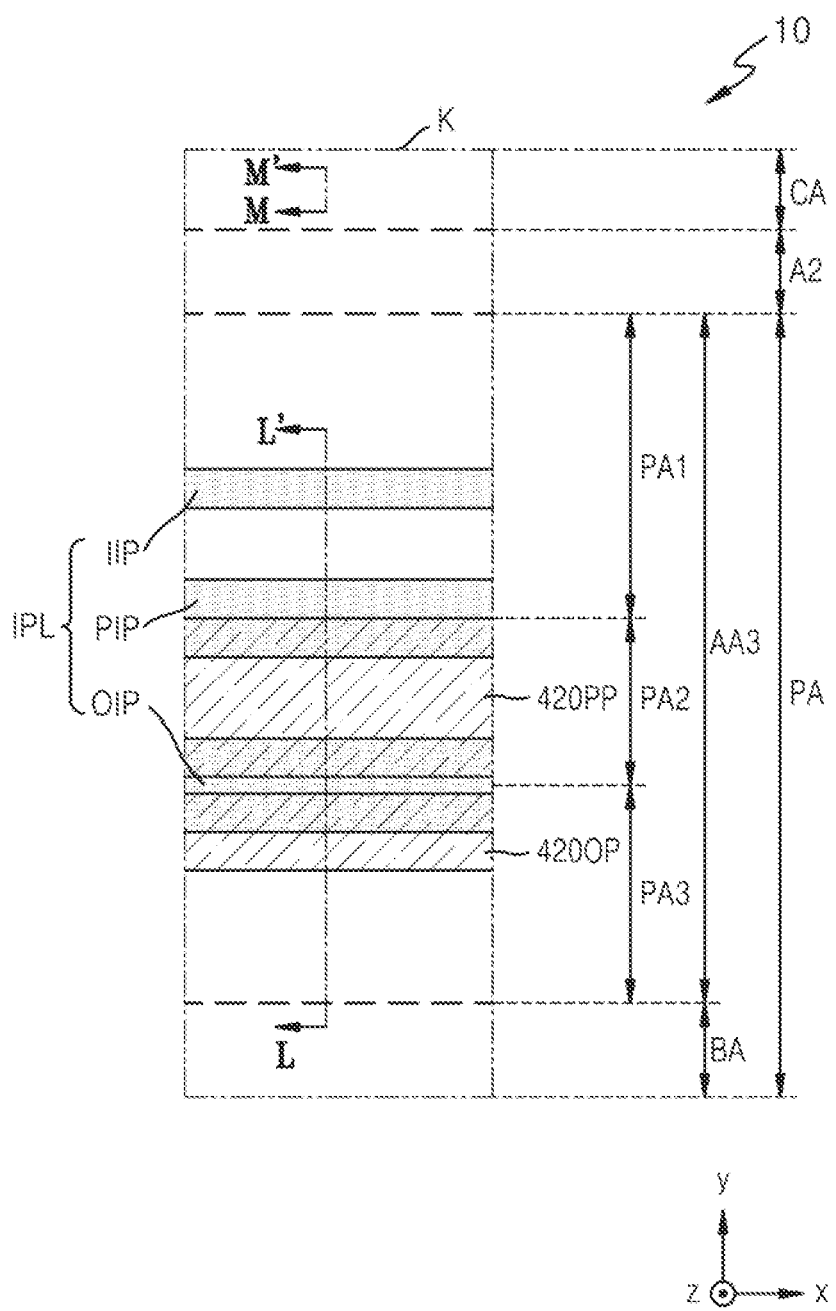
FIG. 9A is an enlarged view of a region K of the display panel of FIG. 3.
Figure 9B:
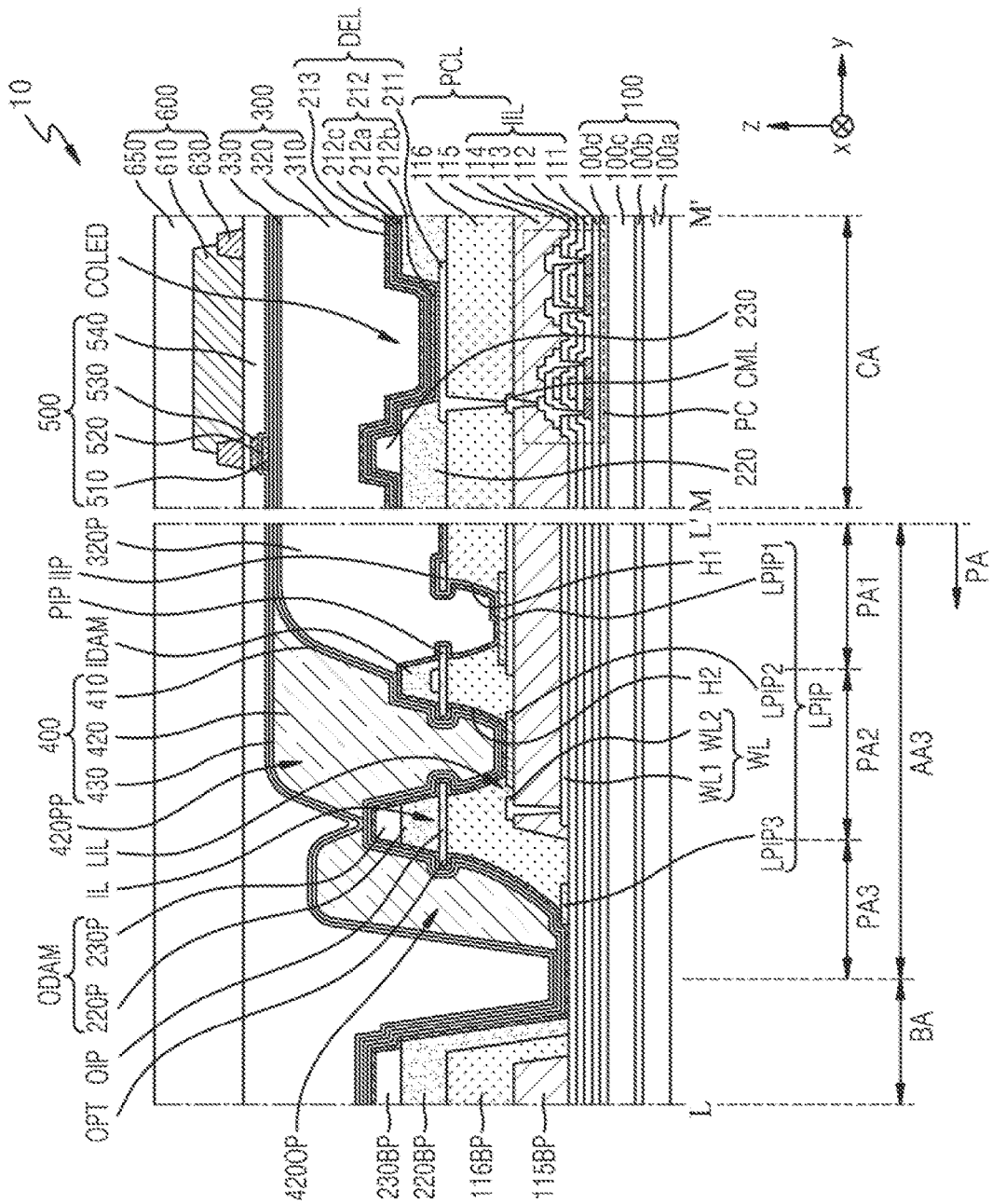
FIG. 9B is a cross-sectional view of the display panel of FIG. 9A, taken along the lines L-L' and M-M'.

FIG. 9A is an enlarged view of a region K of the display panel 10 of FIG. 3. FIG. 9B is a cross-sectional view of the display panel 10 of FIG. 9A, taken along the lines L-L' and M-M'. In FIGS. 9A and 9B, the same reference numerals as those of FIGS. 6A and 6B denote the same members, repeated descriptions thereof are omitted.

Referring to FIGS. 9A and 9B, the display panel 10 may include the substrate 100, the lower inorganic layer LIL, the inorganic layer IL, the display element layer DEL, the encapsulation layer 300, the protection layer 400, the touch sensor layer 500, and the anti-reflection layer 600.

The substrate 100 may include the central area CA, the second area A2, and the peripheral area PA. The second area A2 may be adjacent to the central area CA in the second direction (e.g., the y-direction or the (−) y-direction). The peripheral area PA may be arranged outside the central area CA. In one or more embodiments, the second area A2 may be arranged outside the central area CA, and the peripheral area PA may be arranged outside the second area A2. For example, the second area A2 may be arranged between the peripheral area PA and the central area CA.

In one or more embodiments, the peripheral area PA may include the third adjacent area AA3 and the bending area BA. The third adjacent area AA3 may include the first peripheral area PA1, the second peripheral area PA2, and the third peripheral area PA3. The first peripheral area PA1 may be arranged outside the central area CA. The second peripheral area PA2 may be arranged outside the first peripheral area PA1. For example, the first peripheral area PA1 may be arranged between the second peripheral area PA2 and the central area CA. The third peripheral area PA3 may be arranged outside the second peripheral area PA2. For example, the second peripheral area PA2 may be arranged between the first peripheral area PA1 and the third peripheral area PA3. The bending area BA may be arranged outside the second adjacent area AA2. For example, the second adjacent area AA2 may be arranged between the second area A2 and the bending area BA.

The pixel circuit layer PCL may be arranged on the substrate 100. The pixel circuit layer PCL may include the pixel circuit PC, the inorganic insulating layer IIL, the wiring WL, the lower insulating layer 115, the connection electrode CML, and the insulating layer 116. The pixel circuit PC may overlap the central area CA. The wiring WL may overlap the peripheral area PA. The wiring WL may include the first wiring WL1 and the second wiring WL2.

The lower insulating layer 115 may be arranged on the inorganic insulating layer IIL. In one or more embodiments, the lower insulating layer 115 may be arranged between the substrate 100 and the insulating layer 116. The lower insulating layer 115 may cover at least a portion of the first wiring WL1. Accordingly, the lower insulating layer 115 may prevent or reduce the deterioration of the lateral surface of the first wiring WL1. In one or more embodiments, the lower insulating layer 115 may be continuously arranged in the first peripheral area PA1 of the third adjacent area AA3 and the second peripheral area PA2 of the third adjacent area AA3.

The lower inorganic layer LIL may overlap the peripheral area PA. The lower inorganic layer LIL may not overlap the central area CA. The lower inorganic layer LIL may be arranged under the insulating layer 116. In one or more embodiments, the lower inorganic layer LIL may be arranged between the substrate 100 and the insulating layer 116. As an example, the lower inorganic layer LIL may be arranged between the inorganic insulating layer IIL and the insulating layer 116. As another example, the lower inorganic layer LIL may be arranged between the lower insulating layer 115 and the insulating layer 116.

The lower inorganic layer LIL may include the lower peripheral inorganic pattern LPIP. In one or more embodiments, the lower peripheral inorganic pattern LPIP may be arranged on the second wiring WL2. The lower peripheral inorganic pattern LPIP may include the first lower peripheral inorganic pattern LPIP1, the second lower peripheral inorganic pattern LPIP2, and the third lower peripheral inorganic pattern LPIP3.

The insulating layer 116 may be arranged over the substrate 100. The insulating layer 116 may be arranged on the lower insulating layer 115 and the lower inorganic layer LIL. The insulating layer 116 may cover the edge of the second wiring WL2. Accordingly, the insulating layer 116 may prevent or reduce the deterioration of the lateral surface of the second wiring WL2. The insulating layer 116 may include the first hole H1 and the second hole H2. The first hole H1 may overlap the first peripheral area PA1. The first hole H1 may overlap the first lower peripheral inorganic pattern LPIP1. The second hole H2 may overlap the second peripheral area PA2. The second hole H2 may overlap the second lower peripheral inorganic pattern LPIP2.

The inorganic layer IL may be arranged on the insulating layer 116. The inorganic layer IL may overlap the peripheral area PA. In one or more embodiments, the inorganic layer IL may not overlap the central area CA. The inorganic layer IL may include the inorganic pattern line IPL. In one or more embodiments, the inorganic pattern line IPL may extend in the first direction (e.g., the x-direction or the (−) x-direction) in the peripheral area PA. As an example, the inorganic pattern line IPL may extend in the first direction (e.g., the x-direction or the (−) x-direction) in the second adjacent area AA2. The display element layer DEL may be arranged on the insulating layer 116.

The encapsulation layer 300 may be arranged on the display element layer DEL. The encapsulation layer 300 may be arranged in the central area CA and the peripheral area PA. The encapsulation layer 300 may include the first inorganic encapsulation layer 310, the organic encapsulation layer 320, and the second inorganic encapsulation layer 330.

The protection layer 400 may be arranged on the encapsulation layer 300. The protection layer 400 may protect the encapsulation layer 300. The protection layer 400 may include the first inorganic protection layer 410, the organic protection layer 420, and the second inorganic protection layer 430. The organic protection layer 420 may include the peripheral protection pattern 420PP and the outer protection pattern 420OP. In one or more embodiments, the peripheral protection pattern 420PP may be separated from and/or spaced from the outer protection pattern 420OP in the third adjacent area AA3. In another embodiment, the peripheral protection pattern 420PP and the outer protection pattern 420OP may be provided as one body (e.g., a monolithic structure) in the third adjacent area AA3.

The touch sensor layer 500 may be arranged on the protection layer 400. The touch sensor layer 500 may include the first touch conductive layer 510, the first touch insulating layer 520, the second touch conductive layer 530, and the second touch insulating layer 540.

The anti-reflection layer 600 may be arranged on the touch sensor layer 500. In one or more embodiments, the anti-reflection layer 600 may include the color filter 610, the black matrix 630, and the planarization layer 650.

The inorganic insulating layer IIL, a first bending pattern 115BP, a second bending pattern 116BP, a third bending pattern 220BP, and a fourth bending pattern 230BP may be sequentially stacked in the bending area BA. The first bending pattern 115BP may include the same material as the material of the lower insulating layer 115. The second bending pattern 116BP may include the same material as the material of the insulating layer 116. The third bending pattern 220BP may include the same material as the material of the pixel-defining layer 220. The fourth bending pattern 230BP may include the same material as the material of the spacer 230.

The first inorganic encapsulation layer 310, the second inorganic encapsulation layer 330, the first inorganic protection layer 410, the second inorganic protection layer 430, the first touch insulating layer 520, the second touch insulating layer 540, and the planarization layer 650 may extend from the third adjacent area AA3 to or toward the bending area BA. The first inorganic encapsulation layer 310, the second inorganic encapsulation layer 330, the first inorganic protection layer 410, the second inorganic protection layer 430, the first touch insulating layer 520, the second touch insulating layer 540, and the planarization layer 650 may be arranged on the fourth bending pattern 230BP.

Figure 10:
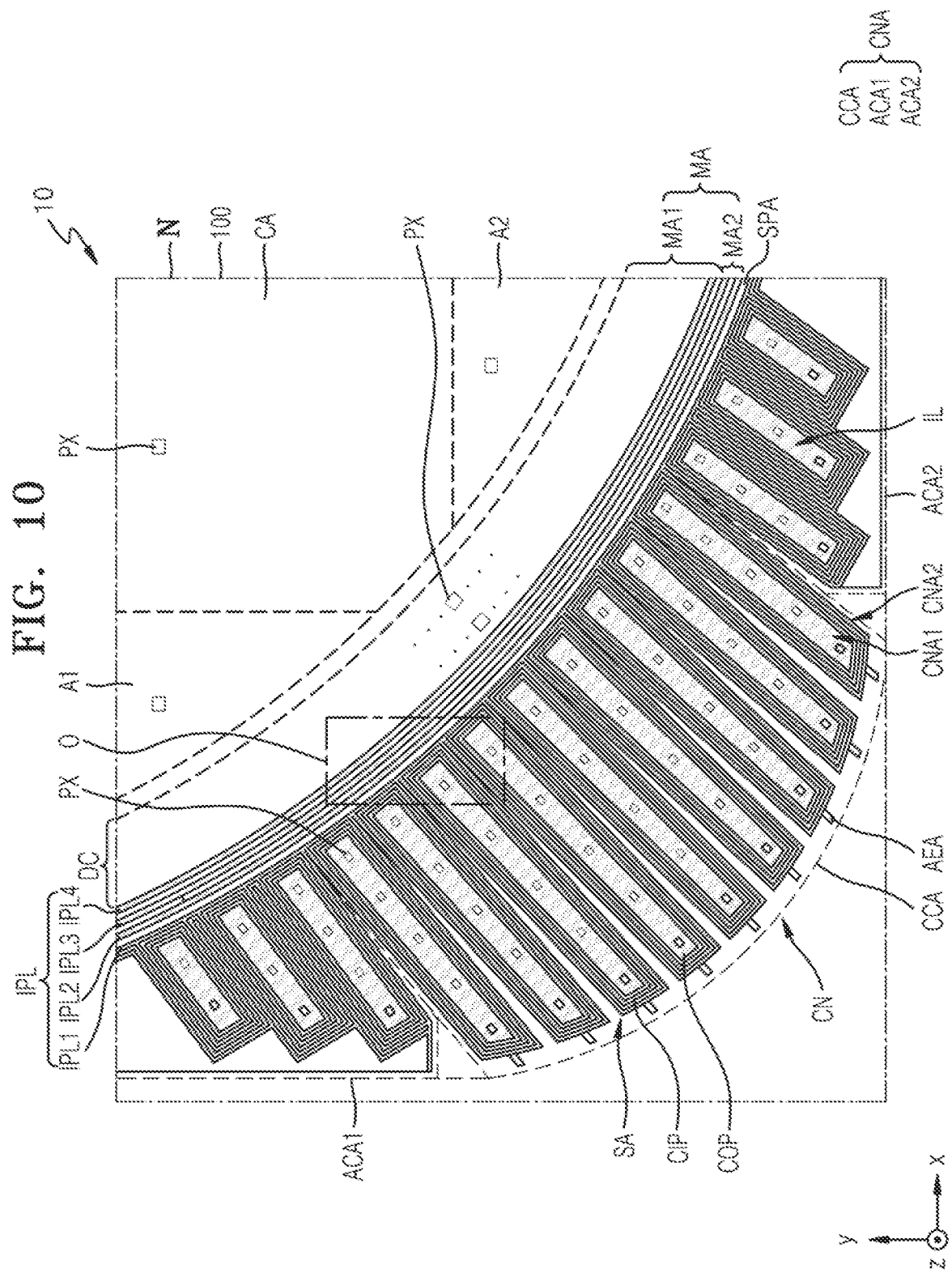
FIG. 10 is an enlarged view of a region N of the display panel of FIG. 3.
Figure 11:
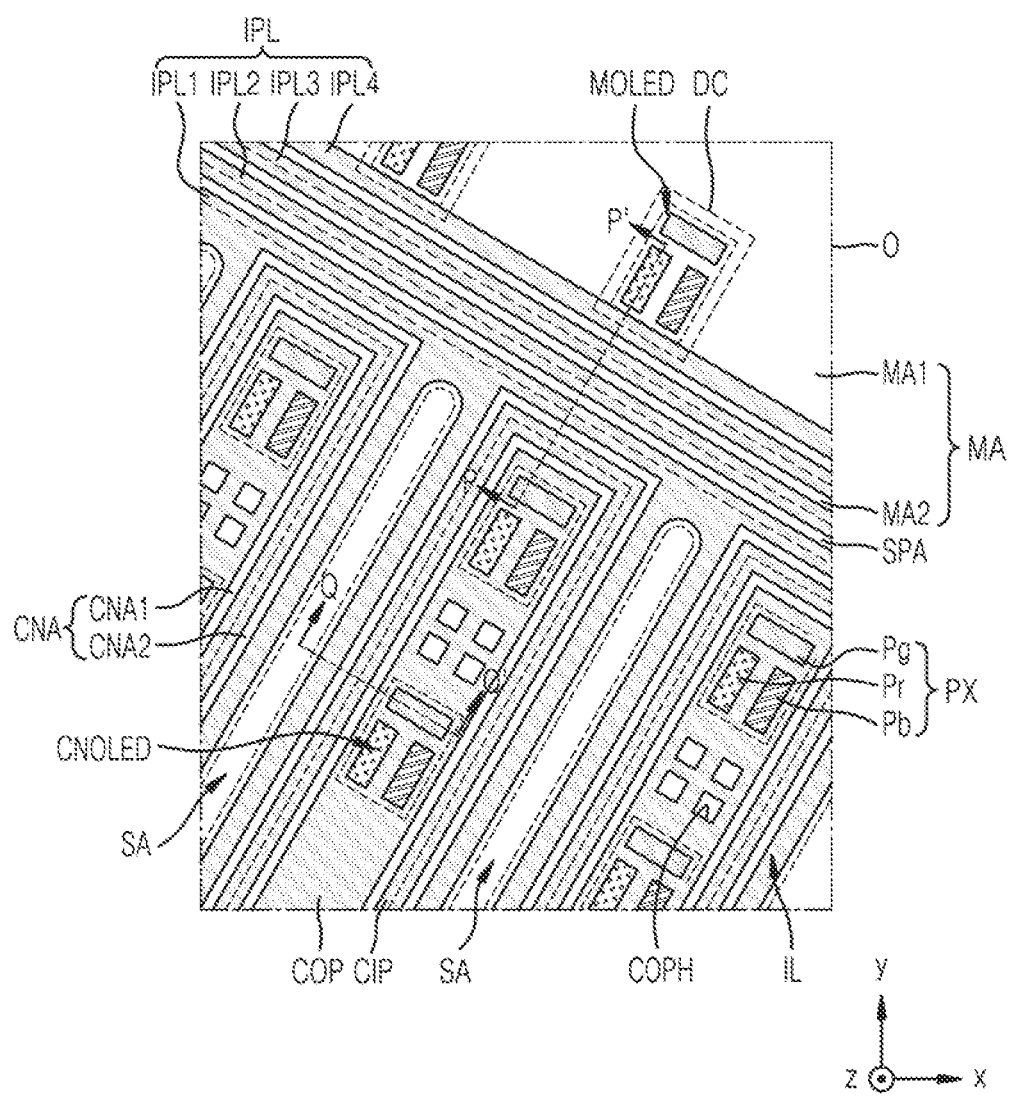
FIG. 11 is an enlarged view of a region O of the display panel of FIG. 10.

FIG. 10 is an enlarged view of a region N of the display panel 10 of FIG. 3. FIG. 11 is an enlarged view of a region O of the display panel 10 of FIG. 10.

Referring to FIGS. 10 and 11, the display panel 10 may include the substrate 100, the inorganic layer IL, and the pixel PX. The substrate 100 may include the central area CA, the first area A1, the second area A2, the corner area CNA, the intermediate area MA, and a separation area SPA.

The first area A1 may be adjacent to the central area CA in the first direction (e.g., the x-direction or the (-) x-direction). The first area A1 may extend in the first direction (e.g., the x-direction or the (-) x-direction) from the central area CA. The second area A2 may be adjacent to the central area CA in the second direction (e.g., the y-direction or the (-) y-direction). The second area A2 may extend in the second direction (e.g., the y-direction or the (-) y-direction) from the central area CA.

The corner area CNA may be a region arranged in the corner CN of the display panel 10. In one or more embodiments, the corner area CNA may be a region where the edge of the display panel 10 in the first direction (e.g., the x-direction or the (-) x-direction) meets the edge of the display panel 10 in the second direction (e.g., the y-direction or the (-) y-direction). In one or more embodiments, the corner area CNA may surround at least a portion of the central area CA, the first area A1, and the second area A2. The corner area CNA may surround at least a portion of the central area CA, the first area A1, the second area A2, and the intermediate area MA. The corner area CNA may include a central corner area CCA, a first adjacent corner area ACA1, and a second adjacent corner area ACA2.

The central corner area CCA may extend in a direction away from the central area CA. The central corner area CCA may include a first corner area CNA1 and a second corner area CNA2. In one or more embodiments, the central corner area CCA may include a plurality of first corner areas CNA1. The plurality of first corner areas CNA1 may each extend in a direction away from the central area CA. In one or more embodiments, the plurality of first corner areas CNA1 may extend in a direction crossing the first direction (e.g., the x-direction or the (-) x-direction) and the second direction (e.g., the y-direction or the (-) y-direction).

The second corner area CNA2 may surround the first corner area CNA1. The second corner area CNA2 may surround a plurality of first corner areas CNA1. In one or more embodiments, a spaced area SA may be defined between a portion of the second corner area CNA2 arranged between adjacent first corner areas CNA1 among the plurality of first corner areas CNA1 and another portion of the second corner area CNA2 arranged between the adjacent first corner areas CNA1.

The spaced area SA may be a region in which the elements of the display panel 10 are not arranged. While the central corner area CCA is bent in the corner CN, compressive strain greater than tensile strain may occur in the central corner area CCA. In the present embodiment, because the spaced area SA is defined between a portion of the second corner area CNA2 arranged between adjacent first corner areas CNA1 among the plurality of first corner areas CNA1 and another portion of the second corner area CNA2 arranged between the adjacent first corner areas CNA1, the central corner area CCA may contract. Accordingly, the display panel 10 may be bent without damage to the central corner area CCA. In one or more embodiments, the central corner area CCA may include an auxiliary extension area AEA extending from the end of the second corner area CNA2.

The first adjacent corner area ACA1 may neighbor the central corner area CCA. In one or more embodiments, at least a portion of the first area A1 and the first adjacent corner area ACA1 may be arranged in the first direction (e.g., the x-direction or the (-) x-direction). An end of the central corner area CCA and an end of the first adjacent corner area ACA1 that are adjacent to each other may be spaced from each other. The spaced area SA may not be defined inside the first adjacent corner area ACA1.

The second adjacent corner area ACA2 may be adjacent to the central corner area CCA. At least a portion of the second area A2 may be arranged between the central area CA and the second adjacent corner area ACA2 in the second direction (e.g., the y-direction or the (-) y-direction). An end of the central corner area CCA and an end of the second adjacent corner area ACA2 that are adjacent to each other may be spaced from each other. The spaced area SA may not be defined inside the second adjacent corner area ACA2.

The intermediate area MA may be arranged between the central area CA and the corner area CNA. The intermediate area MA may extend between the corner area CNA and the first area A1. The intermediate area MA may extend between the corner area CNA and the second area A2. The driving circuit DC and/or the power wiring may be arranged in the intermediate area MA, the driving circuit DC being configured to provide electric signals to the pixel PX, and the power wiring being configured to provide power to the pixel PX. In this case, the pixel PX arranged in the intermediate area MA may overlap the driving circuit DC and/or the power wiring. In one or more embodiments, the driving circuit DC arranged in the intermediate area MA may be omitted.

The intermediate area MA may include a first intermediate area MA1 and a second intermediate area MA2. The first intermediate area MA1 may be arranged outside the central area CA. For example, the first intermediate area MA1 may be arranged between the central area CA and the corner area CNA. The second intermediate area MA2 may be arranged outside the first intermediate area MA1. For example, the second intermediate area MA2 may be arranged between the first intermediate area MA1 and the corner area CNA. The second intermediate area MA2 may surround at least a portion of the first intermediate area MA1.

The separation area SPA may be arranged between the second intermediate area MA2 and the second corner area CNA2.

The inorganic layer IL may overlap the corner area CNA, the separation area SPA, and the intermediate area MA. In one or more embodiments, the inorganic layer IL may not overlap the central area CA, the first area A1, and the second area A2. The inorganic layer IL may include an overlapping inorganic pattern COP, a corner inorganic pattern CIP, and the inorganic pattern line IPL.

The overlapping inorganic pattern COP may overlap the first corner area CNA1. In one or more embodiments, the overlapping inorganic pattern COP may be provided in plurality. The plurality of overlapping inorganic patterns COP may overlap a plurality of first corner areas CNA1. The overlapping inorganic pattern COP may include an overlapping inorganic pattern hole COPH. The overlapping inorganic pattern hole COPH may serve as a path configured to discharge a gas occurring from a layer including an organic material and arranged below the overlapping inorganic pattern COP. Accordingly, the reliability of the display panel 10 may be improved. The overlapping inorganic pattern hole COPH may not overlap the pixel PX. In one or more embodiments, the overlapping inorganic pattern hole COPH may be provided in plurality. The plurality of overlapping inorganic pattern holes COPH may be alternately arranged with the plurality of pixels PX in the first corner area CNA1.

The corner inorganic pattern CIP may surround the overlapping inorganic pattern COP. The corner inorganic pattern CIP may be provided in plurality. The plurality of corner inorganic patterns CIP may respectively surround the plurality of overlapping inorganic patterns COP.

The inorganic pattern line IPL may surround at least a portion of the central area CA. In one or more embodiments, the inorganic pattern line IPL may surround at least a portion of the central area CA, the first area A1, and the second area A2. In one or more embodiments, the inorganic pattern line IPL may extend between the pixel PX arranged in the central area CA and the pixel PX arranged in the corner area CNA. In one or more embodiments, the inorganic pattern line IPL may extend between the pixel PX arranged in the intermediate area MA and the pixel PX arranged in the corner area CNA. The inorganic pattern line IPL may include a first inorganic pattern line IPL1, a second inorganic pattern line IPL2, a third inorganic pattern line IPL3, and a fourth inorganic pattern line IPL4.

The first inorganic pattern line IPL1 may surround the first corner area CNA1. In one or more embodiments, a portion of the first inorganic pattern line IPL1 may extend to the corner area CNA and surround the first corner area CNA1. The first inorganic pattern line IPL1 may surround a plurality of first corner areas CNA1. In one or more embodiments, the first inorganic pattern line IPL1 may surround the overlapping inorganic pattern COP and the corner inorganic pattern CIP. The first inorganic pattern line IPL1 may surround a plurality of overlapping inorganic patterns COP and a plurality of corner inorganic patterns CIP. In this case, the corner inorganic pattern CIP may be arranged between the overlapping inorganic pattern COP and the first inorganic pattern line IPL1.

The second inorganic pattern line IPL2 may be adjacent to the first inorganic pattern line IPL1. The first inorganic pattern line IPL1 may surround at least a portion of the second inorganic pattern line IPL2. The first inorganic pattern line IPL1 may be arranged between the second inorganic pattern line IPL2 and the corner inorganic pattern CIP.

The third inorganic pattern line IPL3 may be adjacent to the second inorganic pattern line IPL2. The second inorganic pattern line IPL2 may surround at least a portion of the third inorganic pattern line IPL3. The second inorganic pattern line IPL2 may be arranged between the first inorganic pattern line IPL1 and the third inorganic pattern line IPL3.

The fourth inorganic pattern line IPL4 may be adjacent to the third inorganic pattern line IPL3. The third inorganic pattern line IPL3 may surround at least a portion of the fourth inorganic pattern line IPL4. The third inorganic pattern line IPL3 may be arranged between the second inorganic pattern line IPL2 and the fourth inorganic pattern line IPL4.

The pixel PX may be arranged in at least one of the central area CA, the first area A1, the second area A2, the corner area CNA, or the intermediate area MA. In one or more embodiments, the plurality of pixels PX may be arranged in the central area CA, the first area A1, the second area A2, the corner area CNA, and the intermediate area MA. Accordingly, the display panel 10 may display images in the central area CA, the first area A1, the second area A2, the corner area CNA, and the intermediate area MA. The plurality of pixels PX may include a plurality of display elements. In one or more embodiments, the pixel PX overlapping the first corner area CNA1 may include a corner organic light-emitting diode CNOLED as a corner display element. The pixel PX overlapping the first intermediate area MA1 may include an intermediate organic light-emitting diode MOLED as an intermediate display element.

In one or more embodiments, the pixel PX may include a red sub-pixel Pr, a green sub-pixel Pg, and a blue sub-pixel Pb. The red sub-pixel Pr, the green sub-pixel Pg, and the blue sub-pixel Pb may respectively emit red light, green light, and blue light.

The red sub-pixel Pr, the green sub-pixel Pg, and the blue sub-pixel Pb may be arranged in an S-stripe structure. The red sub-pixel Pr and the blue sub-pixel Pb may be arranged on a first column 11, and the green sub-pixel Pg may be arranged on a second column 21. In one or more embodiments, a side of the green sub-pixel Pg may face a side of the red sub-pixel Pr and a side of the blue sub-pixel Pb. Alternatively, in one or more embodiments, the red sub-pixel Pr, the green sub-pixel Pg, and the blue sub-pixel Pb may be arranged side by side, or arranged in a PENTILE® configuration, but the present disclosure is not limited thereto. This PENTILE® configuration may also be referred to as an RGBG matrix configuration. PENTILE® is a registered trademark of Samsung Display Co., Ltd., Republic of Korea.

Figure 12A:
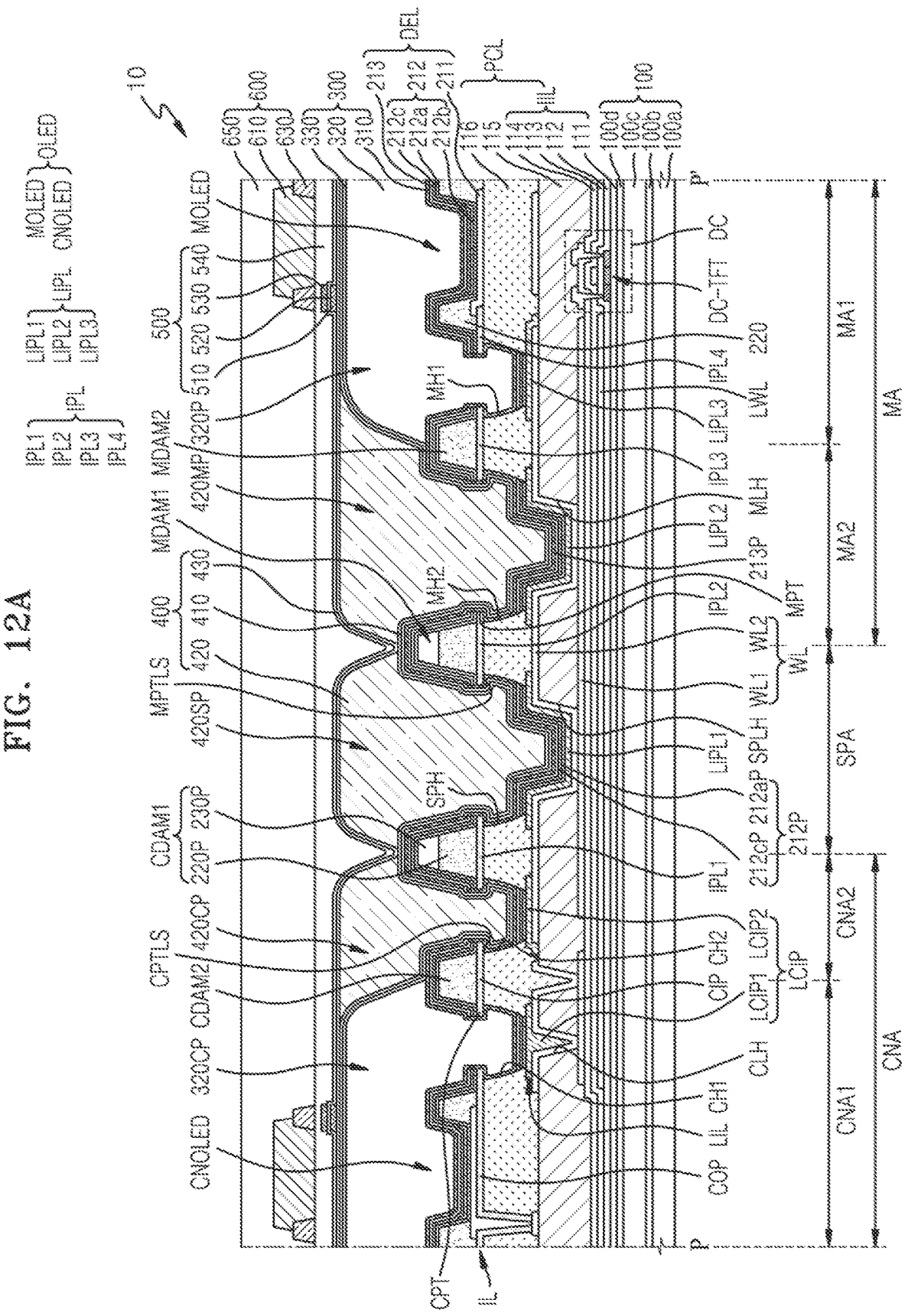
FIGS. 12A and 12B are cross-sectional views of the display panel of FIG. 11, taken along the line P-P' according to various embodiments.
Figure 12B:
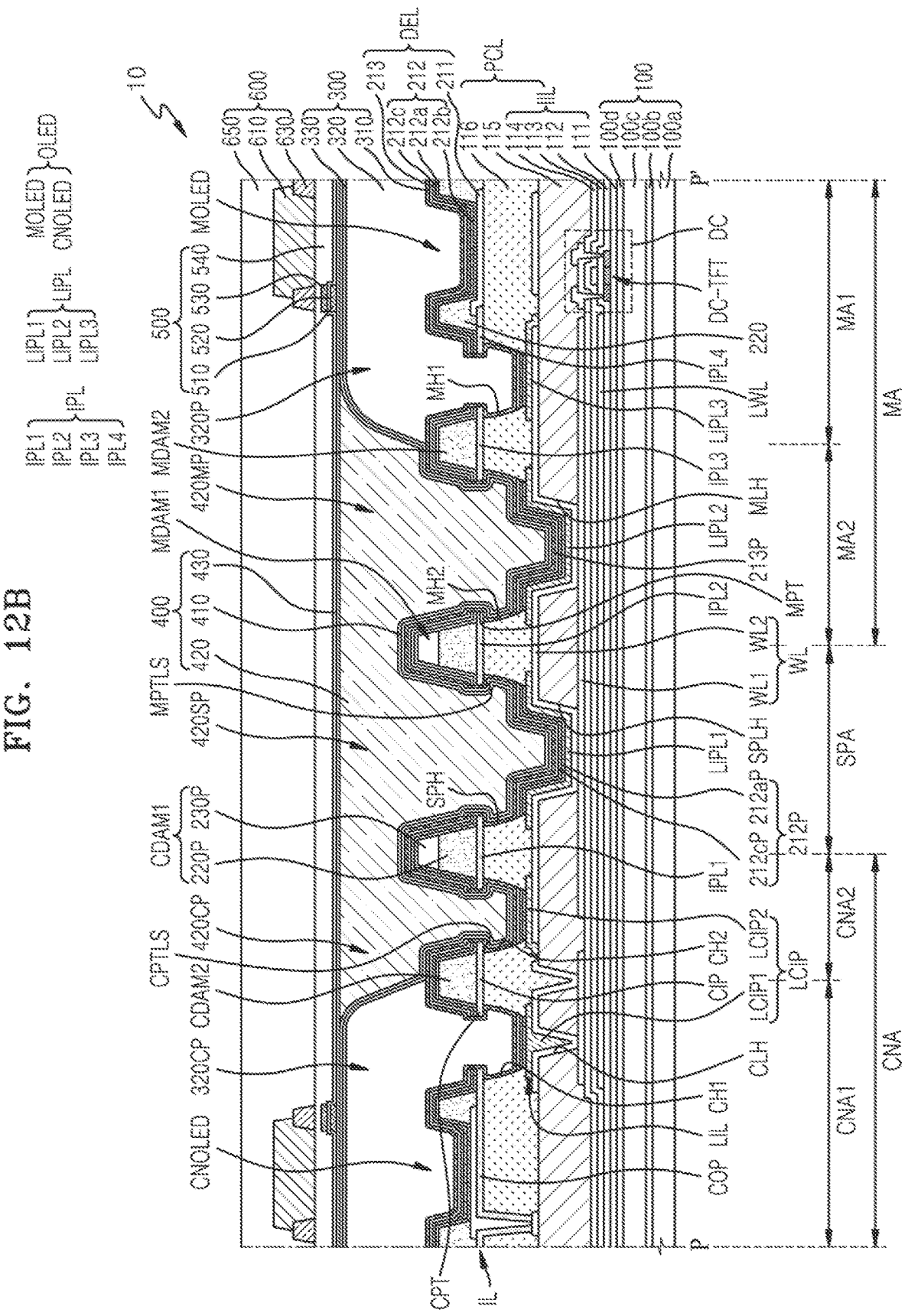

FIGS. 12A and 12B are cross-sectional views of the display panel 10 of FIG. 11, taken along the line P-P' according to various embodiments. In FIGS. 12A and 12B, the same reference numerals as those of FIGS. 6A and 6B denote the same members, repeated descriptions thereof are omitted.

Referring to FIGS. 12A and 12B, the display panel 10 may include the substrate 100, the pixel circuit layer PCL, the lower inorganic layer LIL, the inorganic layer IL, the display element layer DEL, the encapsulation layer 300, the protection layer 400, the touch sensor layer 500, and the anti-reflection layer 600.

The substrate 100 may include the central area CA, the corner area CNA, the intermediate area MA, and the separation area SPA. The corner area CNA may be arranged in the corner of the display panel 10. The corner area CNA may include the first corner area CNA1 and the second corner area CNA2. The second corner area CNA2 may surround the first corner area CNA1. In one or more embodiments, the second corner area CNA2 may be arranged between the first corner area CNA1 and the intermediate area MA. The intermediate area MA may be arranged between the central area and the corner area CNA. The intermediate area MA may include the first intermediate area MA1 and the second intermediate area MA2. The second intermediate area MA2 may be arranged between the first intermediate area MA1 and the corner area CNA. The separation area SPA may be arranged between the second corner area CNA2 and the second intermediate area MA2.

The pixel circuit layer PCL may be arranged on the substrate 100. The pixel circuit layer PCL may include the driving circuit DC, the inorganic insulating layer IIL, a lower wiring LWL, the wiring WL, the lower insulating layer 115, the connection electrode CML, and the insulating layer 116. The wiring WL may include the first wiring WL1 and the second wiring WL2.

The inorganic insulating layer IIL may be arranged on the substrate 100. In one or more embodiments, the inorganic insulating layer IIL may include the buffer layer 111, the first gate insulating layer 112, the second gate insulating layer 113, and the interlayer insulating layer 114.

The lower wiring LWL may be configured to transfer a power voltage and/or electric signals to a pixel arranged in the corner area CNA. The lower wiring LWL may be inserted into the inorganic insulating layer IIL. In one or more embodiments, the lower wiring LWL may be arranged between the first gate insulating layer 112 and the second gate insulating layer 113. In another embodiment, the lower wiring LWL may be arranged between the second gate insulating layer 113 and the interlayer insulating layer 114. The lower wiring LWL may include a conductive material including molybdenum (Mo), aluminum (Al), copper (Cu), and/or titanium (Ti) and have a single-layer structure or a multi-layer structure including the above materials.

The driving circuit DC may be arranged in the first intermediate area MA1. The driving circuit DC may include at least one thin-film transistor. In one or more embodiments, the driving circuit DC may include the driving circuit thin-film transistor DC-TFT.

The first wiring WL1 may be arranged on the inorganic insulating layer IIL. The first wiring WL1 may extend from the intermediate area MA to or toward the corner area CNA.

The lower insulating layer 115 may be arranged on the inorganic insulating layer IIL. In one or more embodiments, the lower insulating layer 115 may be arranged between the substrate 100 and the insulating layer 116. The lower insulating layer 115 may cover at least a portion of the first wiring WL1. Accordingly, the lower insulating layer 115 may prevent or reduce the deterioration of the lateral surface of the first wiring WL1.

The lower insulating layer 115 may include at least one of a corner lower hole CLH, a separation lower hole SPLH, or an intermediate lower hole MLH. The corner lower hole CLH may overlap the corner area CNA. The separation lower hole SPLH may overlap the separation area SPA. The lower intermediate lower hole MLH may overlap the intermediate area MA.

The corner lower hole CLH, the separation lower hole SPLH, and the intermediate lower hole MLH may prevent or reduce an issue that moisture or a foreign substance from the outside penetrates into the first corner area CNA1 and/or the first intermediate area MA1 through the lower insulating layer 115.

The second wiring WL2 may be arranged on the lower insulating layer 115. The second wiring WL2 may be arranged between the lower insulating layer 115 and the insulating layer 116. In one or more embodiments, the second wiring WL2 may overlap at least one of the corner lower hole CLH, the separation lower hole SPLH, or the intermediate lower hole MLH. In one or more embodiments, the second wiring WL2 may be connected to the first wiring WL1 through at least one of the corner lower hole CLH, the separation lower hole SPLH, or the intermediate lower hole MLH.

The lower inorganic layer LIL may overlap the corner area CNA, the separation area SPA, and the intermediate area MA. The lower inorganic layer LIL may be arranged below the insulating layer 116. As an example, the lower inorganic layer LIL may be arranged between the lower insulating layer 115 and the insulating layer 116.

The lower inorganic layer LIL may include a lower corner inorganic pattern LCIP and a lower inorganic pattern line LIPL. In one or more embodiments, the lower corner inorganic pattern LCIP and the lower inorganic pattern line LIPL may be arranged on the second wiring WL2. In one or more embodiments, the lower corner inorganic pattern LCIP may overlap the corner lower hole CLH. The lower corner inorganic pattern LCIP may overlap at least one of the separation lower hole SPLH or the intermediate lower hole MLH.

In one or more embodiments, the lower corner inorganic pattern LCIP may include a first lower corner inorganic pattern LCIP1 and a second lower corner inorganic pattern LCIP2. The first lower corner inorganic pattern LCIP1 may overlap the first corner area CNA1. The second lower corner inorganic pattern LCIP2 may overlap the second corner area CNA2.

Similar to the inorganic pattern line IPL, the lower inorganic pattern line LIPL may extend between an intermediate organic light-emitting diode MOLED and a corner organic light-emitting diode CNOLED. The lower inorganic pattern line LIPL may include a first lower inorganic pattern line LIPL1, a second lower inorganic pattern line LIPL2, and a third lower inorganic pattern line LIPL3. The first lower inorganic pattern line LIPL1 may overlap the separation area SPA. The second lower inorganic pattern line LIPL2 may overlap the second intermediate area MA2. The third lower inorganic pattern line LIPL3 may overlap the first intermediate area MA1.

The insulating layer 116 may be arranged on the substrate 100. The insulating layer 116 may be arranged on the lower insulating layer 115 and the lower inorganic layer LIL. The insulating layer 116 may cover the edge of the second wiring WL2. Accordingly, the insulating layer 116 may prevent or reduce the deterioration of the lateral surface of the second wiring WL2. The insulating layer 116 may include a first corner hole CH1, a second corner hole CH2, a separation hole SPH, a first intermediate hole MH1, and a second intermediate hole MH2.

The first corner hole CH1 may overlap the first corner area CNA1. The first corner hole CH1 may overlap the first lower corner inorganic pattern LCIP1. The second corner hole CH2 may overlap the second corner area CNA2. The second corner hole CH2 may overlap the second lower corner inorganic pattern LCIP2. The separation hole SPH may overlap the first lower inorganic pattern line LIPL1. The second intermediate hole MH2 may overlap the second lower inorganic pattern line LIPL2. The first intermediate hole MH1 may overlap the third lower inorganic pattern line LIPL3. At least one of the first corner hole CH1, the second corner hole CH2, the separation hole SPH, the first intermediate hole MH1, or the second intermediate hole MH2 may pass through the insulating layer 116. In this case, at least one of the first corner hole CH1, the second corner hole CH2, the separation hole SPH, the first intermediate hole MH1, or the second intermediate hole MH2 may be formed by etching the insulating layer 116. In this case, the lower inorganic layer LIL may prevent or reduce over-etching of elements under the lower inorganic layer LIL. As an example, the lower inorganic layer LIL may prevent or reduce an issue where the second wiring WL2 is over-etched and a resistance thereof increases. In one or more embodiments, at least one of the first corner hole CH1, the second corner hole CH2, the separation hole SPH, the first intermediate hole MH1, or the second intermediate hole MH2 may not pass through the insulating layer 116. In this case, at least one of the first corner hole CH1, the second corner hole CH2, the separation hole SPH, the first intermediate hole MH1, or the second intermediate hole MH2 may be a groove of the insulating layer 116. In one or more embodiments, the lower inorganic layer LIL may be omitted.

The first corner hole CH1, the second corner hole CH2, the separation hole SPH, the first intermediate hole MH1, and the second intermediate hole MH2 may prevent or reduce an issue that moisture or a foreign substance from the outside penetrates into the first corner area CNA1 and/or the first intermediate area MA1 through the insulating layer 116. The first corner hole CH1, the second corner hole CH2, the separation hole SPH, the first intermediate hole MH1, and the second intermediate hole MH2 may serve as a path configured to discharge a gas occurring from the lower insulating layer 115 and the insulating layer 116 while the display panel 10 is manufactured. Accordingly, an issue that a gas occurring from the lower insulating layer 115 and/or the insulating layer 116 penetrates into the first corner area CNA1 and/or the first intermediate area MA1 and, thus, damages the display element may be prevented or reduced.

The inorganic layer IL may be arranged on the insulating layer 116. The inorganic layer IL may overlap the corner area CNA, the separation area SPA, and the intermediate area MA. The inorganic layer IL may include the overlapping inorganic pattern COP, the corner inorganic pattern CIP, and the inorganic pattern line IPL. The overlapping inorganic pattern COP, the corner inorganic pattern CIP, and the inorganic pattern line IPL may be spaced from each other.

The overlapping inorganic pattern COP may overlap the first corner area CNA1. The inorganic pattern line IPL may extend between the intermediate organic light-emitting diode MOLED as an intermediate display element in the intermediate area MA and the corner organic light-emitting diode CNOLED as a display element in the corner area CNA. The inorganic pattern line IPL may include the first inorganic pattern line IPL1, the second inorganic pattern line IPL2, the third inorganic pattern line IPL3, and the fourth inorganic pattern line IPL4. The first inorganic pattern line IPL1, the second inorganic pattern line IPL2, the third inorganic pattern line IPL3, and the fourth inorganic pattern line IPL4 may be spaced from each other.

The corner inorganic pattern CIP may be arranged between the overlapping inorganic pattern COP and the first inorganic pattern line IPL1. The first inorganic pattern line IPL1 may be arranged between the second inorganic pattern line IPL2 and the corner inorganic pattern CIP. The second inorganic pattern line IPL2 may be arranged between the first inorganic pattern line IPL1 and the third inorganic pattern line IPL3. The third inorganic pattern line IPL3 may be arranged between the second inorganic pattern line IPL2 and the fourth inorganic pattern line IPL4.

The overlapping inorganic pattern COP may include a protrusion tip protruding toward the center of the first corner hole CH1. Accordingly, the lower surface of the protrusion tip of the overlapping inorganic pattern COP may be exposed in the first corner hole CH1.

The corner inorganic pattern CIP may include a corner protrusion tip CPT protruding toward the center of one of the first corner hole CH1 and the second corner hole CH2. In one or more embodiments, the corner inorganic pattern CIP may protrude toward the center of the first corner hole CH1 and/or the second corner hole CH2. Accordingly, a lower surface CPTLS of the corner protrusion tip CPT may be exposed through at least one of the first corner hole CH1 or the second corner hole CH2.

The inorganic pattern line IPL may include an intermediate protrusion tip MPT protruding toward the center of at least one of the second corner hole CH2, the separation hole SPH, or the second intermediate hole MH2. Accordingly, a lower surface MPTLS of the intermediate protrusion tip MPT may be exposed through at least one of the second corner hole CH2, the separation hole SPH, or the second intermediate hole MH2.

The first inorganic pattern line IPL1 may include a protrusion tip protruding toward the center of at least one of the second corner hole CH2 or the separation hole SPH. In one or more embodiments, the first inorganic pattern line IPL1 may protrude toward the center of the second corner hole CH2 and/or the separation hole SPH. Accordingly, the lower surface of the protrusion tip of the first inorganic pattern line IPL1 may be exposed through at least one of the second corner hole CH2 or the separation hole SPH.

The second inorganic pattern line IPL2 may include a protrusion tip protruding toward the center of at least one of the separation hole SPH or the second intermediate hole MH2. In one or more embodiments, the second inorganic pattern line IPL2 may protrude toward the center of the separation hole SPH and/or the second intermediate hole MH2. Accordingly, the lower surface of the protrusion tip of the second inorganic pattern line IPL2 may be exposed through at least one of the separation hole SPH or the second intermediate hole MH2.

The third inorganic pattern line IPL3 may include a protrusion tip protruding toward the center of at least one of the first intermediate hole MH1 or the second intermediate hole MH2. In one or more embodiments, the third inorganic pattern line IPL3 may protrude toward the center of the first intermediate hole MH1 and/or the second intermediate hole MH2. Accordingly, the lower surface of the protrusion tip of the third inorganic pattern line IPL3 may be exposed through the first intermediate hole MH1 and the second intermediate hole MH2.

The fourth inorganic pattern line IPL4 may include a protrusion tip protruding toward the center of the first intermediate hole MH1. In one or more embodiments, the fourth inorganic pattern line IPL4 may protrude toward the center of the first intermediate hole MH1. Accordingly, the lower surface of the protrusion tip of the fourth inorganic pattern line IPL4 may be exposed through the first intermediate hole MH1.

The display element layer DEL may be arranged on the insulating layer 116. The display element layer DEL may include a first pattern 220P, a second pattern 230P, a functional layer pattern 212P, and a second electrode pattern 213P. The organic light-emitting diode OLED, which is a display element, may include the intermediate organic light-emitting diode MOLED, which is an intermediate display element, and the corner organic light-emitting diode CNOLED, which is a corner display element. The organic light-emitting diode OLED may include the first electrode 211, the intermediate layer 212 including the emission layer 212b, and the second electrode 213. The organic light-emitting diode OLED may further include at least one of the first functional layer 212a or the second functional layer 212c, the first functional layer 212a being between the first electrode 211 and the emission layer 212b, and the second functional layer 212c being between the emission layer 212b and the second electrode 213. In one or more embodiments, the first electrode 211 of the intermediate organic light-emitting diode MOLED may overlap at least a portion of the fourth inorganic pattern line IPL4. The intermediate organic light-emitting diode MOLED may be arranged on the driving circuit DC.

In one or more embodiments, the functional layer pattern 212P may overlap at least one of the first corner hole CH1, the second corner hole CH2, the separation hole SPH, the first intermediate hole MH1, or the second intermediate hole MH2. In one or more embodiments, the functional layer pattern 212P may be arranged between the substrate 100 and the organic protection layer 420. As an example, the functional layer pattern 212P may be arranged between the lower inorganic layer LIL and the first inorganic encapsulation layer 310. The functional layer pattern 212P may include at least one of a first functional layer pattern 212aP or a second functional layer pattern 212cP. In one or more embodiments, the functional layer pattern 212P may include the same material as the material of the first functional layer 212a and/or the second functional layer 212c. In one or more embodiments, the first functional layer pattern 212aP may include the same material as the material of the first functional layer 212a. The second functional layer pattern 212cP may include the same material as the material of the second functional layer 212c.

The second electrode pattern 213P may be arranged on the functional layer pattern 212P. The second electrode pattern 213P may overlap at least one of the first corner hole CH1, the second corner hole CH2, the separation hole SPH, the first intermediate hole MH1, or the second intermediate hole MH2. The second electrode pattern 213P may include the same material as the material of the second electrode 213.

The first pattern 220P may overlap the corner area CNA, the separation area SPA, and the intermediate area MA. The first pattern 220P may be provided in plurality in the corner area CNA, the separation area SPA, and the intermediate area MA. The first pattern 220P may include the same material as the material of the pixel-defining layer 220.

The second pattern 230P may be arranged on the first pattern 220P. The second pattern 230P may include the same material as the material of the spacer. In one or more embodiments, the first pattern 220P and the second pattern 230P arranged on the first inorganic pattern line IPL1 may constitute a first corner dam CDAM1. For example, the first corner dam CDAM1 may be arranged on the first inorganic pattern line IPL1 and may include the first pattern 220P and the second pattern 230P.

The first pattern 220P arranged on the corner inorganic pattern CIP may constitute a second corner dam CDAM2. For example, the second corner dam CDAM2 may overlap the corner inorganic pattern CIP and include the first pattern 220P. The second corner dam CDAM2 may be arranged between the corner organic light-emitting diode CNOLED and the first corner dam CDAM1.

The first pattern 220P and the second pattern 230P arranged on the second inorganic pattern line IPL2 may constitute a first intermediate dam MDAM1. For example, the first intermediate dam MDAM1 may be arranged on the second inorganic pattern line IPL2 and may include the first pattern 220P and the second pattern 230P.

The first pattern 220P arranged on the third inorganic pattern line IPL3 may constitute a second intermediate dam MDAM2. For example, the second intermediate dam MDAM2 may overlap the third inorganic pattern line IPL3 and include the first pattern 220P. The second intermediate dam MDAM2 may be arranged between the intermediate organic light-emitting diode MOLED and the first intermediate dam MDAM1.

In one or more embodiments, the thickness (or height) of the first corner dam CDAM1 may be greater than the thickness (or height) of the second corner dam CDAM2. The thickness (or height) of the first intermediate dam MDAM1 may be greater than the thickness (or height) of the second intermediate dam MDAM2. While the display element layer DEL is formed, a mask sheet may be used. The first corner dam CDAM1 and the first intermediate dam MDAM1 may prevent or reduce damage, by the mask sheet, to the display element layer DEL. In this case, at least one of the second pattern 230P of the first corner dam CDAM1 or the second pattern 230P of the first intermediate dam MDAM1 may contact the mask sheet, and thus, the shape of the at least one may be transformed. In this case, the first inorganic encapsulation layer 310 may be arranged along the transformed shape, and barrier characteristics thereof may be reduced.

In the present embodiment, the second corner dam CDAM2 may be arranged between the corner organic light-emitting diode CNOLED and the first corner dam CDAM1, and the second intermediate dam MDAM2 may be arranged between the intermediate organic light-emitting diode MOLED and the first intermediate dam MDAM1. Because the thickness of the second corner dam CDAM2 is less than the thickness of the first corner dam CDAM1, and the thickness of the second intermediate dam MDAM2 is less than the thickness of the first intermediate dam MDAM1, the second corner dam CDAM2 and the second intermediate dam MDAM2 may not contact the mask sheet. Accordingly, the first inorganic encapsulation layer 310 may be arranged on the second corner dam CDAM2 and the second intermediate dam MDAM2 each including a flat upper surface. Accordingly, a time taken for oxygen or moisture to reach the display element may be delayed, and thus, the barrier characteristics of the first inorganic encapsulation layer 310 may be reinforced.

In one or more embodiments, the first corner dam CDAM1, the second corner dam CDAM2, the first intermediate dam MDAM1, and the second intermediate dam MDAM2 may have the same thickness.

The inorganic layer IL may be an element configured to improve the reliability of the display panel 10. The first functional layer 212a and the second functional layer 212c may each include an organic material. External oxygen or moisture may be introduced to the separation area SPA, the second corner area CNA2, and the second intermediate area MA2 through at least one of the first functional layer 212a or the second functional layer 212c. The oxygen or moisture may damage the display element. The inorganic layer IL may disconnect the first functional layer 212a and the second functional layer 212c by including a protrusion tip protruding toward the center of at least one of the first corner hole CH1 or the second corner hole CH2, and prevent or reduce the introduction of external moisture or oxygen to the corner organic light-emitting diode CNOLED. In addition, the inorganic layer IL may disconnect the first functional layer 212a and the second functional layer 212c by including a protrusion tip protruding toward the center of at least one of the first intermediate hole MH1 or the second intermediate hole MH2, and prevent or reduce the introduction of external moisture or oxygen to the intermediate organic light-emitting diode MOLED. Accordingly, the reliability of the display panel 10 may be improved.

The encapsulation layer 300 may be arranged on the display element layer DEL. The encapsulation layer 300 may overlap the corner area CNA, the separation area SPA, and the intermediate area MA. The encapsulation layer 300 may include the first inorganic encapsulation layer 310, the organic encapsulation layer 320, and the second inorganic encapsulation layer 330. The first inorganic encapsulation layer 310 and the second inorganic encapsulation layer 330 may continuously extend from the intermediate area MA to or toward the corner area CNA.

The first inorganic encapsulation layer 310 may contact (e.g., directly contact) the inorganic layer IL. In one or more embodiments, the first inorganic encapsulation layer 310 may contact (e.g., directly contact) the protrusion tips of the inorganic layer IL. As an example, the first inorganic encapsulation layer 310 may contact (e.g., directly contact) the protrusion tip of the overlapping inorganic pattern COP, the corner protrusion tip CPT of the corner inorganic pattern CIP, and the intermediate protrusion tip MPT of the inorganic pattern line IPL. The first inorganic encapsulation layer 310 may contact (e.g., directly contact) the lower surface of the corner protrusion tip CPT. The first inorganic encapsulation layer 310 may contact (e.g., directly contact) the lower surface MPTLS of the intermediate protrusion tip MPT. Accordingly, an issue that external moisture or oxygen is introduced to the corner organic light-emitting diode CNOLED or the intermediate organic light-emitting diode MOLED as a display element may be prevented or reduced.

The organic encapsulation layer 320 may overlap the first corner area CNA1 and the first intermediate area MA1. The organic encapsulation layer 320 may include the organic encapsulation pattern 320P and a corner organic encapsulation pattern 320CP. The organic encapsulation pattern 320P and the corner organic encapsulation pattern 320CP may be separated from and/or spaced from each other around the separation area SPA. For example, the organic encapsulation pattern 320P and the corner organic encapsulation pattern 320CP may be spaced from each other by the separation area SPA. The organic encapsulation pattern 320P may overlap the first intermediate area MA1. The organic encapsulation pattern 320P may extend to the first intermediate hole MH1 on the intermediate organic light-emitting diode MOLED. The second intermediate dam MDAM2 may control the flow of the organic material forming the organic encapsulation pattern 320P. The organic encapsulation pattern 320P may fill the first intermediate hole MH1. The corner organic encapsulation pattern 320CP may overlap the first corner area CNA1. The corner organic encapsulation pattern 320CP may extend to the first corner hole CH1 on the corner organic light-emitting diode CNOLED. The corner organic encapsulation pattern 320CP may fill the first corner hole CH1. The second corner dam CDAM2 may control the flow of the organic material forming the corner organic encapsulation pattern 320CP.

The second inorganic encapsulation layer 330 may be arranged on the organic encapsulation layer 320. The second inorganic encapsulation layer 330 may contact (e.g., directly contact) the first inorganic encapsulation layer 310 on the second corner dam CDAM2 and the second intermediate dam MDAM2. In one or more embodiments, the second inorganic encapsulation layer 330 may contact (e.g., directly contact) the first inorganic encapsulation layer 310 on the second corner hole CH2, the separation hole SPH, and the second intermediate hole MH2.

The protection layer 400 may be arranged on the encapsulation layer 300. The protection layer 400 may protect the encapsulation layer 300. The protection layer 400 may include the first inorganic protection layer 410, the organic protection layer 420, and the second inorganic protection layer 430. The first inorganic protection layer 410 and the second inorganic protection layer 430 may continuously extend from the intermediate area MA to or toward the corner area CNA.

The organic protection layer 420 may be arranged on the first inorganic protection layer 410. The organic protection layer 420 may overlap the second corner area CNA2, the separation area SPA, and the second intermediate area MA2. In one or more embodiments, the organic protection layer 420 may extend from the second corner area CNA2 to or toward the first corner area CNA1 and overlap the edge of the corner organic encapsulation pattern 320CP. The organic protection layer 420 may extend from the second intermediate area MA2 to or toward the first intermediate area MA1 and overlap the organic encapsulation pattern 320P. The organic protection layer 420 may include a corner protection pattern 420CP, a separation protection pattern 420SP, and an intermediate protection pattern 420MP.

The corner protection pattern 420CP may overlap the second corner area CNA2. The corner protection pattern 420CP may fill the second corner hole CH2. The separation protection pattern 420SP may overlap the separation area SPA. The separation protection pattern 420SP may fill the separation hole SPH. The intermediate protection pattern 420MP may overlap the second intermediate area MA2. The intermediate protection pattern 420MP may fill the second intermediate hole MH2.

The corner protection pattern 420CP may overlap the corner protrusion tip CPT of the corner inorganic pattern CIP. The corner protection pattern 420CP may surround the corner protrusion tip CPT of the corner inorganic pattern CIP. The corner protection pattern 420CP may overlap the protrusion tip of the first inorganic pattern line IPL1. The corner protection pattern 420CP may surround the protrusion tip of the first inorganic pattern line IPL1.

At least one of the separation protection pattern 420SP or the intermediate protection pattern 420MP may overlap the intermediate protrusion tip MPT of the inorganic pattern line IPL. In one or more embodiments, the separation protection pattern 420SP may overlap the protrusion tip of the first inorganic pattern line IPL1. The separation protection pattern 420SP may surround the protrusion tip of the first inorganic pattern line IPL1. The separation protection pattern 420SP may overlap the protrusion tip of the second inorganic pattern line IPL2. The separation protection pattern 420SP may surround the protrusion tip of the second inorganic pattern line IPL2. In one or more embodiments, the intermediate protection pattern 420MP may overlap the protrusion tip of the second inorganic pattern line IPL2. The intermediate protection pattern 420MP may surround the protrusion tip of the second inorganic pattern line IPL2. The intermediate protection pattern 420MP may overlap the protrusion tip of the third inorganic pattern line IPL3. The intermediate protection pattern 420MP may surround the protrusion tip of the third inorganic pattern line IPL3.

When the organic protection layer 420 is omitted, cracks may occur in the corner protrusion tip CPT, the intermediate protrusion tip MPT, the first inorganic encapsulation layer 310, and/or the second inorganic encapsulation layer 330 that do not overlap the organic encapsulation layer 320. In this case, oxygen or moisture may be transmitted through the cracks. As an example, oxygen or moisture may be transmitted through the cracks, the functional layer pattern 212P, and the insulating layer 116. In the present embodiment, the organic protection layer 420 may prevent or reduce an issue that cracks occur in the corner protrusion tip CPT, the intermediate protrusion tip MPT, the first inorganic encapsulation layer 310, and/or the second inorganic encapsulation layer 330 that do not overlap the organic encapsulation layer 320 due to external impacts, and thus, improve the reliability of the display panel 10.

The second inorganic protection layer 430 may be arranged on the organic protection layer 420. Referring to FIG. 12A, the corner protection pattern 420CP, the separation protection pattern 420SP, and the intermediate protection pattern 420MP may be separated from and/or spaced from each other. In this case, the first inorganic protection layer 410 may contact (e.g., directly contact) the second inorganic protection layer 430 on the first corner dam CDAM1 and the first intermediate dam MDAM1. In addition, the second inorganic protection layer 430 may contact (e.g., directly contact) the first inorganic protection layer 410 on the first corner area CNA1 and/or the first intermediate area MA1. Referring to FIG. 12B, the corner protection pattern 420CP, the separation protection pattern 420SP, and the intermediate protection pattern 420MP may be provided as one body (e.g., a monolithic structure). In this case, the second inorganic protection layer 430 may contact (e.g., directly contact) the first inorganic protection layer 410 on the first corner area CNA1 and/or the first intermediate area MA1.

The touch sensor layer 500 may be arranged on the protection layer 400. The touch sensor layer 500 may include the first touch conductive layer 510, the first touch insulating layer 520, the second touch conductive layer 530, and the second touch insulating layer 540.

The anti-reflection layer 600 may be arranged on the touch sensor layer 500. In one or more embodiments, the anti-reflection layer 600 may include the color filter 610, the black matrix 630, and the planarization layer 650. In one or more embodiments, the color filters 610 may overlap the intermediate organic light-emitting diode MOLED and/or the corner organic light-emitting diode CNOLED.

The functional layer pattern 212P may overlap the first corner hole CH1, the second corner hole CH2, the separation hole SPH, the first intermediate hole MH1, and the second intermediate hole MH2. The second electrode pattern 213P may be arranged on the functional layer pattern 212P. The functional layer pattern 212P may reduce adhesive force between the layers of the display panel 10. When the protection layer 400 is omitted, while the touch sensor layer 500 and the anti-reflection layer 600 are formed, the touch sensor layer 500 and the anti-reflection layer 600 may be separated from the layers thereunder. In the present embodiment, because the functional layer pattern 212P is arranged between the substrate 100 and the organic protection layer 420, an issue that the touch sensor layer 500 and the anti-reflection layer 600 are separated from the layers thereunder may be prevented or reduced.

Figure 13:
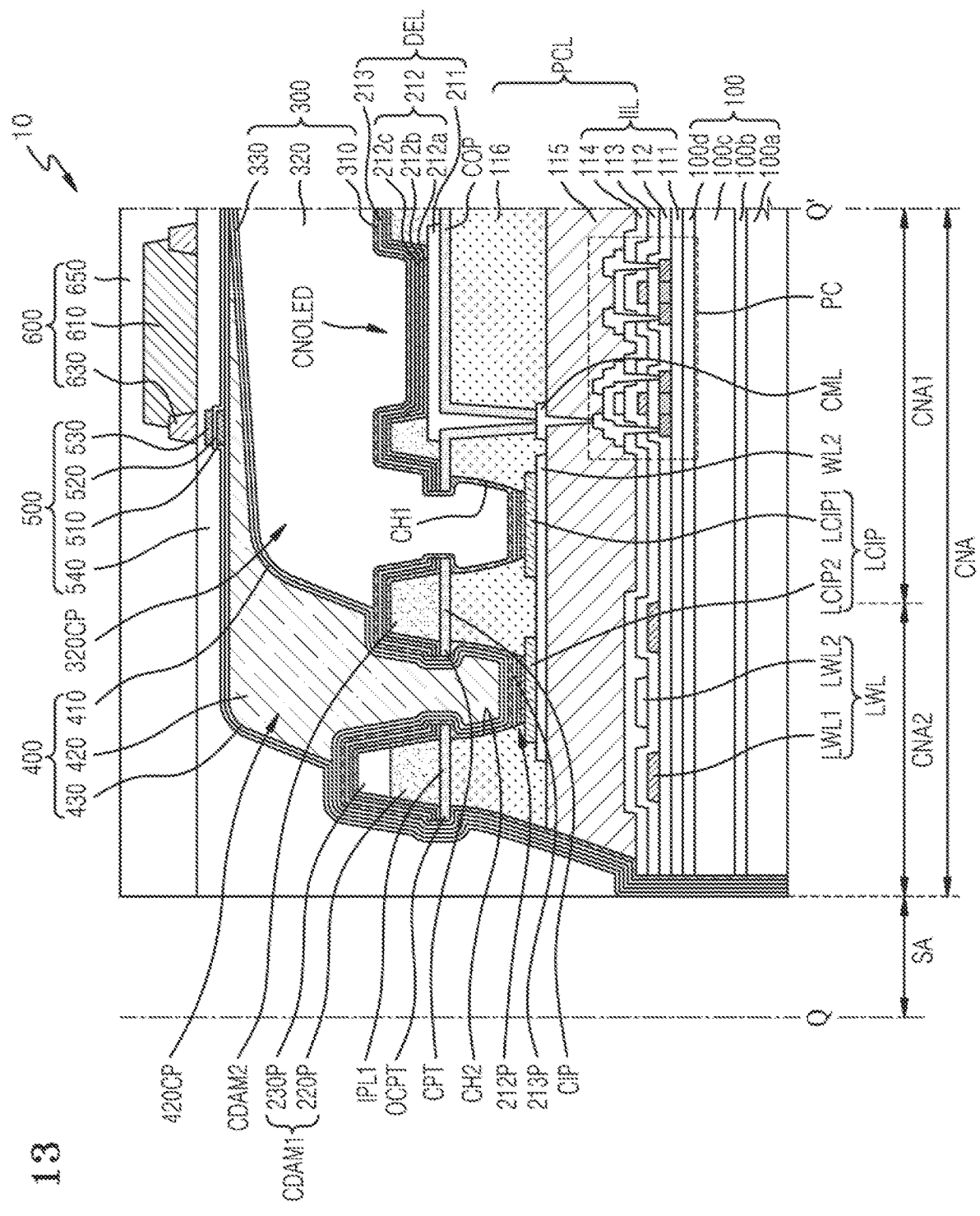
FIG. 13 is a cross-sectional view of the display panel of FIG. 11, taken along the line Q-Q'.

FIG. 13 is a cross-sectional view of the display panel 10 of FIG. 11, taken along the line Q-Q'. In FIG. 13, the same reference numerals as those of FIG. 12A denote the same members, repeated descriptions thereof are omitted.

Referring to FIG. 13, the display panel 10 may include the substrate 100, the pixel circuit layer PCL, the lower inorganic layer LIL, the inorganic layer IL, the display element layer DEL, the encapsulation layer 300, the protection layer 400, the touch sensor layer 500, and the anti-reflection layer 600.

The substrate 100 may include the corner area CNA arranged in the corner of the display panel 10. The corner area CNA may include the first corner area CNA1 and the second corner area CNA2. The second corner area CNA2 may surround the first corner area CNA1. In one or more embodiments, the spaced area SA may be defined between a portion of the second corner area CNA2 arranged between adjacent first corner areas CNA1 among the plurality of first corner areas CNA1 and another portion of the second corner area CNA2 arranged between the adjacent first corner areas CNA1.

The pixel circuit layer PCL may be arranged on the substrate 100. The pixel circuit layer PCL may include the inorganic insulating layer IIL, a lower connection line LCL, the lower wiring LWL, the lower insulating layer 115, the second wiring WL2, the connection electrode CML, and the insulating layer 116.

The inorganic insulating layer IIL may be arranged on the substrate 100. In one or more embodiments, the inorganic insulating layer IIL may include the buffer layer 111, the first gate insulating layer 112, the second gate insulating layer 113, and the interlayer insulating layer 114. In one or more embodiments, the inorganic insulating layer IIL may include a region that does not overlap the lower insulating layer 115.

The lower wiring LWL may be configured to transfer a power voltage and/or electric signals to the pixels arranged in the corner area CNA. The lower wiring LWL may be inserted into the inorganic insulating layer K. In one or more embodiments, the lower wiring LWL may include a first lower wiring LWL1 and a second lower wiring LWL2. The first lower wiring LWL1 may be arranged between the first gate insulating layer 112 and the second gate insulating layer 113. The second lower wiring LWL2 may be arranged between the second gate insulating layer 113 and the interlayer insulating layer 114.

The lower insulating layer 115 may be arranged on the inorganic insulating layer IIL. In one or more embodiments, the lower insulating layer 115 may be arranged between the substrate 100 and the insulating layer 116. In one or more embodiments, the lower insulating layer 115 may include a lower corner hole in the first corner area CNA1 and/or the second corner area CNA2.

The connection electrode CML and the second wiring WL2 may be arranged on the lower insulating layer 115. The connection electrode CML and the second wiring WL2 may be arranged between the lower insulating layer 115 and the insulating layer 116.

The lower inorganic layer LIL may overlap the corner area CNA. The lower inorganic layer LIL may be arranged under the insulating layer 116. As an example, the lower inorganic layer LIL may be arranged between the lower insulating layer 115 and the insulating layer 116.

The lower inorganic layer LIL may include the lower corner inorganic pattern LCIP. In one or more embodiments, the lower corner inorganic pattern LCIP may be arranged on the second wiring WL2. In one or more embodiments, the lower corner inorganic pattern LCIP may include the first lower corner inorganic pattern LCIP1 and the second lower corner inorganic pattern LCIP2. The first lower corner inorganic pattern LCIP1 may overlap the first corner area CNA1. The second lower corner inorganic pattern LCIP2 may overlap the second corner area CNA2. In one or more embodiments, the lower inorganic layer LIL may be omitted.

The insulating layer 116 may be arranged over the substrate 100. The insulating layer 116 may be arranged on the lower insulating layer 115 and the lower inorganic layer LIL. The insulating layer 116 may cover the edge of the second wiring WL2. The insulating layer 116 may include the first corner hole CH1 and the second corner hole CH2.

The first corner hole CH1 may overlap the first corner area CNA1. The first corner hole CH1 may overlap the first lower corner inorganic pattern LCIP1. The second corner hole CH2 may overlap the second corner area CNA2. The second corner hole CH2 may overlap the second lower corner inorganic pattern LCIP2.

The inorganic layer IL may be arranged on the insulating layer 116. The inorganic layer IL may overlap the corner area CNA. The inorganic layer IL may include the overlapping inorganic pattern COP, the corner inorganic pattern CIP, and the first inorganic pattern line IPL1. The overlapping inorganic pattern COP, the corner inorganic pattern CIP, and the first inorganic pattern line IPL1 may be spaced from each other.

The overlapping inorganic pattern COP may overlap the first corner area CNA1. The corner inorganic pattern CIP may be arranged between the overlapping inorganic pattern COP and the first inorganic pattern line IPL1.

The overlapping inorganic pattern COP may include a protrusion tip protruding toward the center of the first corner hole CH1. Accordingly, the lower surface of the protrusion tip of the overlapping inorganic pattern COP may be exposed in the first corner hole CH1.

The corner inorganic pattern CIP may include the corner protrusion tip CPT protruding toward the center of at least one of the first corner hole CH1 or the second corner hole CH2. In one or more embodiments, the corner inorganic pattern CIP may protrude toward the centers of the first corner hole CH1 and/or the second corner hole CH2. Accordingly, the lower surface of the corner protrusion tip CPT may be exposed in at least one of the first corner hole CH1 or the second corner hole CH2.

The first inorganic pattern line IPL1 may include a protrusion tip protruding toward the center of the second corner hole CH2. The first inorganic pattern line IPL1 may protrude toward the center of the second corner hole CH2. Accordingly, the lower surface of the protrusion tip of the first inorganic pattern line IPL1 may be exposed in the second corner hole CH2. The first inorganic pattern line IPL1 may include an outer corner protrusion tip OCPT protruding in a direction from the second corner area CNA2 toward the spaced area SA.

The display element layer DEL may be arranged on the insulating layer 116. The display element layer DEL may include a display element, the first pattern 220P, the second pattern 230P, the functional layer pattern 212P, and the second electrode pattern 213P. As a corner display element, the corner organic light-emitting diode CNOLED may include the first electrode 211, the intermediate layer 212 including the emission layer 212b, and the second electrode 213. The corner organic light-emitting diode CNOLED may further include at least one of the first functional layer 212a or the second functional layer 212c, the first functional layer 212a being between the first electrode 211 and the emission layer 212b, and the second functional layer 212c being between the emission layer 212b and the second electrode 213.

In one or more embodiments, the functional layer pattern 212P may overlap at least one of the first corner hole CH1 or the second corner hole CH2. In one or more embodiments, the functional layer pattern 212P may be arranged between the substrate 100 and the organic protection layer 420. As an example, the functional layer pattern 212P may be arranged between the lower inorganic layer LIL and the first inorganic encapsulation layer 310. The functional layer pattern 212P may include at least one of the first functional layer pattern 212aP or the second functional layer pattern 212cP. The functional layer pattern 212P may include the same material as the material of at least one of the first functional layer 212a or the second functional layer 212c.

The second electrode pattern 213P may be arranged on the functional layer pattern 212P. The second electrode pattern 213P may overlap at least one of the first corner hole CH1 or the second corner hole CH2.

The first pattern 220P may overlap the corner area CNA. The first pattern 220P may be provided in plurality in the corner area CNA. The second pattern 230P may be arranged on the first pattern 220P. In one or more embodiments, the first pattern 220P and the second pattern 230P on the first inorganic pattern line IPL1 may constitute the first corner dam CDAM1. For example, the first corner dam CDAM1 may be arranged on the first inorganic pattern line IPL1 and may include the first pattern 220P and the second pattern 230P.

The first pattern 220P on the corner inorganic pattern CIP may configure the second corner dam CDAM2. For example, the second corner dam CDAM2 may overlap the corner inorganic pattern CIP and include the first pattern 220P. The second corner dam CDAM2 may be arranged between the corner organic light-emitting diode CNOLED and the first corner dam CDAM1.

The encapsulation layer 300 may be arranged on the display element layer DEL. The encapsulation layer 300 may overlap the corner area CNA. The encapsulation layer 300 may include the first inorganic encapsulation layer 310, the organic encapsulation layer 320, and the second inorganic encapsulation layer 330.

The first inorganic encapsulation layer 310 may contact (e.g., directly contact) the inorganic layer IL. In one or more embodiments, the first inorganic encapsulation layer 310 may contact (e.g., directly contact) the protrusion tips of the inorganic layer IL. As an example, the first inorganic encapsulation layer 310 may contact (e.g., directly contact) the protrusion tip of the overlapping inorganic pattern COP, the corner protrusion tip CPT of the corner inorganic pattern CIP, and the intermediate protrusion tip of the first inorganic pattern line IPL1. The first inorganic encapsulation layer 310 may contact (e.g., directly contact) the inorganic insulating layer IIL.

The organic encapsulation layer 320 may overlap the first corner area CNA1. The organic encapsulation layer 320 may include the corner organic encapsulation pattern 320CP. The corner organic encapsulation pattern 320CP may extend to the first corner hole CH1 on the corner organic light-emitting diode CNOLED. The corner organic encapsulation pattern 320CP may fill the first corner hole CH1. The second corner dam CDAM2 may control the flow of the organic material forming the corner organic encapsulation pattern 320CP.

The second inorganic encapsulation layer 330 may be arranged on the organic encapsulation layer 320. The second inorganic encapsulation layer 330 may contact (e.g., directly contact) the first inorganic encapsulation layer 310 in the second corner dam CDAM2. In one or more embodiments, the second inorganic encapsulation layer 330 may contact (e.g., directly contact) the first inorganic encapsulation layer 310 in the second corner hole CH2.

The protection layer 400 may be arranged on the encapsulation layer 300. The protection layer 400 may protect the encapsulation layer 300. The protection layer 400 may include the first inorganic protection layer 410, the organic protection layer 420, and the second inorganic protection layer 430.

The organic protection layer 420 may be arranged on the first inorganic protection layer 410. The organic protection layer 420 may overlap the second corner area CNA2. In one or more embodiments, the organic protection layer 420 may extend from the second corner area CNA2 to or toward the first corner area CNA1 and overlap the edge of the corner organic encapsulation pattern 320CP. The organic protection layer 420 may include the corner protection pattern 420CP.

The corner protection pattern 420CP may overlap the second corner area CNA2. The corner protection pattern 420CP may fill the second corner hole CH2. The corner protection pattern 420CP may overlap the corner protrusion tip CPT of the corner inorganic pattern CIP. The corner protection pattern 420CP may surround the corner protrusion tip CPT of the corner inorganic pattern CIP. The corner protection pattern 420CP may overlap the protrusion tip of the first inorganic pattern line IPL1. The corner protection pattern 420CP may surround the protrusion tip of the first inorganic pattern line IPL1. Accordingly, the reliability of the display panel 10 may increase. In one or more embodiments, the corner protection pattern 420CP may overlap the outer corner protrusion tip OCPT of the first inorganic pattern line IPL1.

The second inorganic protection layer 430 may be arranged on the organic protection layer 420.

The touch sensor layer 500 may be arranged on the protection layer 400. The touch sensor layer 500 may include the first touch conductive layer 510, the first touch insulating layer 520, the second touch conductive layer 530, and the second touch insulating layer 540. In one or more embodiments, the second touch insulating layer 540 may overlap the outer corner protrusion tip OCPT of the first inorganic pattern line IPL1. In another embodiment, the second touch insulating layer 540 may not overlap the outer corner protrusion tip OCPT of the first inorganic pattern line IPL1.

The anti-reflection layer 600 may be arranged on the touch sensor layer 500. In one or more embodiments, the anti-reflection layer 600 may include the color filters 610, the black matrix 630, and the planarization layer 650. In one or more embodiments, the color filter 610 may overlap the corner organic light-emitting diode CNOLED.

As described above, the display panel, according to one or more embodiments, may include the organic encapsulation pattern filling the first hole and the peripheral protection pattern filling the second hole, and thus, may prevent or reduce damage to the display element.

In addition, the display apparatus, according to one or more embodiments, may include the corner organic encapsulation pattern filling the first corner hole and the corner protection pattern filling the second corner hole, and thus, may prevent or reduce damage to the display element. In addition, the display apparatus may display images even in the corner area bent in the corner.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display panel comprising:
    a substrate including a central area and a peripheral area, the peripheral area including a first peripheral area and a second peripheral area, the first peripheral area being outside the central area, the second peripheral area being outside the first peripheral area;
    an insulating layer arranged on the substrate, the insulating layer including a first hole and a second hole, the first hole overlapping the first peripheral area, the second hole overlapping the second peripheral area;
    an inorganic layer arranged on the insulating layer, the inorganic layer comprising a peripheral inorganic pattern that comprises a peripheral protrusion tip protruding toward a center of at least one of the first hole or the second hole;
    a display element layer arranged on the insulating layer, the display element layer comprising a central display element overlapping the central area, the central display element comprising a first electrode, an emission layer, and a second electrode that are sequentially stacked;
    an encapsulation layer arranged on the display element layer, the encapsulation layer comprising an organic encapsulation layer; and
    a protection layer arranged on the encapsulation layer, the protection layer comprising an organic protection layer,
    wherein the organic encapsulation layer comprises an organic encapsulation pattern filling the first hole, and
    wherein the organic protection layer comprises a peripheral protection pattern filling the second hole.

2. The display panel of claim 1, wherein the peripheral protection pattern overlaps the peripheral protrusion tip.

3. The display panel of claim 1, wherein the peripheral area further includes a third peripheral area outside the second peripheral area,
    wherein the inorganic layer further comprises an outer inorganic pattern comprising an outer protrusion tip that protrudes in a direction from the second peripheral area toward the third peripheral area, and
    wherein the organic protection layer further comprises an outer protection pattern overlapping the outer protrusion tip.

4. The display panel of claim 1, wherein the substrate further includes a corner area in a corner of the display panel, the corner area including a first corner area and a second corner area that surrounds the first corner area,
    wherein the insulating layer further includes a first corner hole and a second corner hole, the first corner hole overlapping the first corner area, the second corner hole overlapping the second corner area,
    wherein the inorganic layer further comprises a corner inorganic pattern comprising a corner protrusion tip that protrudes toward a center of at least one of the first corner hole or the second corner hole,
    wherein the display element layer further comprises a corner display element overlapping the first corner area,
    wherein the organic encapsulation layer further comprises a corner organic encapsulation pattern overlapping the corner display element, the corner organic encapsulation pattern filling the first corner hole, and
    wherein the organic protection layer further comprises a corner protection pattern overlapping the second corner area, the corner protection pattern filling the second corner hole.

5. The display panel of claim 4, wherein the first corner area comprises a plurality of first corner areas,
    wherein the plurality of first corner areas each extend in a direction away from the central area, wherein the second corner area surrounds the plurality of first corner areas, and wherein a spaced area is defined between a portion of the second corner area and another portion of the second corner area, the portion of the second corner area being between adjacent first corner areas from among the plurality of first corner areas, the other portion of the second corner area being between the adjacent first corner areas.

6. The display panel of claim 4, wherein the substrate further includes an intermediate area and a separation area, wherein the intermediate area is between the central area and the corner area, the intermediate area including a first intermediate area and a second intermediate area between the first intermediate area and the corner area, the separation area being between the second corner area and the second intermediate area, wherein the insulating layer further includes a first intermediate hole, a second intermediate hole, and a separation hole, the first intermediate hole overlapping the first intermediate area, the second intermediate hole overlapping the second intermediate area, the separation hole overlapping the separation area, wherein the organic encapsulation pattern fills the first intermediate hole, the organic encapsulation pattern overlapping the first intermediate area, and wherein the organic protection layer further comprises an intermediate protection pattern and a separation protection pattern, the intermediate protection pattern filling the second intermediate hole, the separation protection pattern filling the separation hole.

7. The display panel of claim 6, wherein the inorganic layer further comprises an inorganic pattern line extending to surround at least a portion of the central area, the inorganic pattern line comprising an intermediate protrusion tip protruding toward a center of at least one of the second corner hole, the second intermediate hole, or the separation hole, and wherein at least one of the separation protection pattern or the intermediate protection pattern overlaps the intermediate protrusion tip.

8. The display panel of claim 6, wherein the central display element further comprises at least one of a first functional layer or a second functional layer, the first functional layer being between the first electrode and the emission layer, the second functional layer being between the emission layer and the second electrode, and wherein the display element layer further comprises a functional layer pattern comprising a same material as a material of at least one of the first functional layer or the second functional layer, overlapping at least one of the second corner hole, the separation hole, or the second intermediate hole, and arranged between the substrate and the organic protection layer.

9. The display panel of claim 6, further comprising a driving circuit overlapping the intermediate area, wherein the display element layer further comprises an intermediate display element overlapping the first intermediate area, the intermediate display element being arranged on the driving circuit.

10. The display panel of claim 4, wherein the substrate further includes:

a first area between the central area and the peripheral area, the first area being adjacent to the central area in a first direction; and a second area between the central area and the peripheral area, the second area being adjacent to the central area in a second direction crossing the first direction, and wherein the corner area surrounds at least a portion of the first area, the second area, and the central area.

11. The display panel of claim 1, wherein the encapsulation layer further comprises a first inorganic encapsulation layer and a second inorganic encapsulation layer, the first inorganic encapsulation layer contacting the peripheral protrusion tip, the second inorganic encapsulation layer being on the organic encapsulation layer, and wherein the first inorganic encapsulation layer contacts the second inorganic encapsulation layer in the second hole.

12. The display panel of claim 1, further comprising a lower inorganic layer arranged between the substrate and the insulating layer, the lower inorganic layer comprising a lower peripheral inorganic pattern, wherein at least one of the first hole or the second hole passes through the insulating layer, and wherein the lower peripheral inorganic pattern overlaps at least one of the first hole or the second hole.

13. The display panel of claim 1, further comprising:

a touch sensor layer arranged on the protection layer; and an anti-reflection layer arranged on the touch sensor layer, the anti-reflection layer comprising color filters and a black matrix.

14. A display apparatus comprising:

a display panel; and a cover window arranged on the display panel, wherein the display panel comprises:

a substrate including a central area and a corner area, the corner area being at a corner of the display panel and bent, the corner area including a first corner area and a second corner area surrounding the first corner area;

an insulating layer arranged on the substrate, the insulating layer including a first corner hole and a second corner hole, the first corner hole overlapping the first corner area, the second corner hole overlapping the second corner area;

an inorganic layer arranged on the insulating layer, the inorganic layer comprising a corner inorganic pattern that has a corner protrusion tip protruding toward a center of at least one of the first corner hole or the second corner hole;

a display element layer arranged on the insulating layer, the display element layer comprising a corner display element overlapping the first corner area;

an encapsulation layer arranged on the display element layer, the encapsulation layer comprising an organic encapsulation layer; and a protection layer arranged on the encapsulation layer, the protection layer comprising an organic protection layer, wherein the organic encapsulation layer comprises a corner organic encapsulation pattern filling the first corner hole, and wherein the organic protection layer comprises a corner protection pattern filling the second corner hole.

15. The display apparatus of claim 14, wherein the first corner area comprises a plurality of first corner areas, wherein the plurality of first corner areas each extend in a direction away from the central area, wherein the second corner area surrounds the plurality of first corner areas, and wherein a spaced area is defined between a portion of the second corner area and another portion of the second corner area, the portion of the second corner area being between adjacent first corner display areas from among the plurality of first corner areas, the other portion of the second corner area being between the adjacent first corner display areas.

16. The display apparatus of claim 14, wherein the substrate further includes an intermediate area and a separation area,
  wherein the intermediate area is between the central area and the corner area, the intermediate area including a first intermediate area and a second intermediate area between the first intermediate area and the corner area, the separation area being between the second corner area and the second intermediate area,
  wherein the insulating layer includes a first intermediate hole, a second intermediate hole, and a separation hole, the first intermediate hole overlapping the first intermediate area, the second intermediate hole overlapping the second intermediate area, the separation hole overlapping the separation area,
  wherein the organic encapsulation layer further comprises an organic encapsulation pattern filling the first intermediate hole, the organic encapsulation pattern overlapping the first intermediate area, and
  wherein the organic protection layer further comprises an intermediate protection pattern and a separation protection pattern, the intermediate protection pattern filling the second intermediate hole, the separation protection pattern filling the separation hole.

17. The display apparatus of claim 14, wherein the substrate further includes:
  a first area adjacent to the central area in a first direction, the first area being bent; and
  a second area adjacent to the central area in a second direction crossing the first direction, the second area being bent, and
  wherein the corner area surrounds at least a portion of the first area, the second area, and the central area.

18. The display apparatus of claim 14, wherein the substrate further includes a peripheral area including a first peripheral area and a second peripheral area, the first peripheral area being outside the central area, the second peripheral area being outside the first peripheral area,
  wherein the insulating layer further includes a first hole and a second hole, the first hole overlapping the first peripheral area, the second hole overlapping the second peripheral area,
  wherein the inorganic layer further comprises a peripheral inorganic pattern that comprises a peripheral protrusion tip protruding toward a center of at least one of the first hole or the second hole,
  wherein the organic encapsulation layer further comprises an organic encapsulation pattern filling the first hole, and
  wherein the organic protection layer further comprises a peripheral protection pattern filling the second hole.

19. The display apparatus of claim 18, wherein the peripheral protection pattern overlaps the peripheral protrusion tip.

20. The display apparatus of claim 18, wherein the peripheral area further includes a third peripheral area outside the second peripheral area,
  wherein the inorganic layer further comprises an outer inorganic pattern comprising an outer protrusion tip that protrudes in a direction from the second peripheral area toward the third peripheral area, and
  wherein the organic protection layer further comprises an outer protection pattern overlapping the outer protrusion tip.

* * * * *